(12) United States Patent
Doi et al.

(10) Patent No.: US 7,826,497 B2
(45) Date of Patent: Nov. 2, 2010

(54) DATA RECEIVING CIRCUIT THAT CAN CORRECTLY RECEIVE DATA, EVEN WHEN HIGH-SPEED DATA TRANSMISSION IS PERFORMED, USING SMALL AMPLITUDE CLOCK

(75) Inventors: Yoshiyasu Doi, Kawasaki (JP); Hirotaka Tamura, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 2105 days.

(21) Appl. No.: 10/328,031

(22) Filed: Dec. 26, 2002

(65) Prior Publication Data

US 2003/0219043 A1 Nov. 27, 2003

(30) Foreign Application Priority Data

May 23, 2002 (JP) .............................. 2002-149119

(51) Int. Cl.
*H04J 3/04* (2006.01)
*H03H 11/26* (2006.01)

(52) U.S. Cl. ...................................... 370/535; 327/261

(58) Field of Classification Search ........................ None
See application file for complete search history.

(56) References Cited

U.S. PATENT DOCUMENTS

| 4,791,628 | A | * | 12/1988 | Swartz | 370/544 |
|---|---|---|---|---|---|
| 5,526,361 | A | * | 6/1996 | Hedberg | 370/518 |
| 5,734,283 | A | * | 3/1998 | Hedberg | 327/277 |
| 6,983,010 | B1 | * | 1/2006 | Sim et al. | 375/229 |
| 7,061,941 | B1 | * | 6/2006 | Zheng | 370/535 |
| 7,408,962 | B2 | * | 8/2008 | Tanabe | 370/535 |
| 2002/0122443 | A1 | * | 9/2002 | Enam et al. | 370/537 |

FOREIGN PATENT DOCUMENTS

JP 2000-022653 1/2000

OTHER PUBLICATIONS

International Publication No. WO 02/23737 A1, published Mar. 21, 2002 and EP 1333 584 A1, published Aug. 6, 2003.

* cited by examiner

*Primary Examiner*—Ricky Ngo
*Assistant Examiner*—Clemence Han
(74) *Attorney, Agent, or Firm*—Arent Fox LLP

(57) ABSTRACT

A data receiving circuit has a data input terminal, a conversion circuit converting an input signal received via the data input terminal, and a decision circuit making a decision on an output of the conversion circuit. The conversion circuit has a demultiplexer converting the input signal into a signal of a lower frequency than the frequency thereof at the data input terminal, and an output of the demultiplexer is obtained at the drain side of each of a plurality of first transistors having a common source.

2 Claims, 24 Drawing Sheets

US 7,826,497 B2

DATA RECEIVING CIRCUIT THAT CAN CORRECTLY RECEIVE DATA, EVEN WHEN HIGH-SPEED DATA TRANSMISSION IS PERFORMED, USING SMALL AMPLITUDE CLOCK

CROSS REFERENCE TO RELATED APPLICATION

This application is based upon and claims the benefit of priority from the prior Japanese Patent Application No. 2002-149119, filed on May 23, 2002, the entire contents of which are incorporated herein by reference.

BACKGROUND OF THE INVENTION

1. Field of the Invention

The present invention relates to a signal transmission technology for enabling high-speed signal transmission between a plurality of LSI chips or a plurality of devices or circuit blocks within a single chip, or between a plurality of boards or cabinets, and more particularly to a data receiving circuit for performing high-speed signal transmission.

2. Description of the Related Art

Recently, the performance of components used in computers and other information processing apparatuses has been greatly improved. In particular, dramatic improvements have been made, for example, in the performance of semiconductor memory devices such as SRAMs (Static Random Access Memories) and DRAMs (Dynamic Random Access Memories), and other semiconductor devices such as processors and switching LSIs.

The improvements in the performance of semiconductor memory devices, processors, etc. have reached the point where system performance cannot be improved further unless the speed of signal transmission between components or elements is increased. Specifically, the speed gap between a semiconductor memory device such as a SRAM or DRAM and a processor, for example, has been widening, and in recent years, this speed gap has become a bottleneck in boosting a computer's overall performance.

Furthermore, the need for an improvement in signal transmission speed is increasing not only for signal transmission between cabinets or boards (printed wiring boards), such as between a server and a main storage device or between servers connected via a network, but also for signal transmission between chips or between devices or circuit blocks within a single chip because of increasing integration and increasing size of semiconductor chips, decreasing supply voltage levels (decreasing signal amplitude levels), etc.

More specifically, there is a need to increase the signal transmission speed per pin in order to address the increase in the amount of data transmission between LSIs or between boards or cabinets. This is also necessary to avoid an increase in package cost, etc. due to an increased pin count. As a result, inter-LSI signal transmission speeds exceeding 2.5 Gbps have been achieved in recent years, and it is now desired to achieve extremely high speeds (high-speed signal transmission) reaching or even exceeding 10 Gbps.

Generally, when constructing a data receiving circuit operating at high speed, it is practiced to provide a demultiplexer (DEMUX) at a position as close as possible to an input data line (data input terminal) within the receiving circuit in order to convert the input data to signals of slower frequency components at the position close to the data input terminal. The DEMUX used in the data receiving circuit has also the function of a sampling circuit, and samples high-speed input data for output as slow-speed data.

However, when the speed of signal transmission between circuit blocks or chips or between cabinets or boards is increased, signal attenuation through signal transmission lines increases and, as a result, the amplitude of the signal received at the data receiving circuit decreases. Furthermore, at the data transmitting circuit also, it becomes difficult to output a large amplitude signal, resulting in a further decrease in the amplitude of the received signal. It is therefore needed to provide a data receiving circuit that has high sensitivity, is capable of operating at high speed, and yet can correctly receive data despite the attenuation of high-frequency signal components.

The prior art and its associated problem will be described in detail later with reference to relevant drawings.

SUMMARY OF THE INVENTION

An object of the present invention is to provide a data receiving circuit that can correctly receive data, even when high-speed data transmission is performed, using a small amplitude clock.

According to the present invention, there is provided a data receiving circuit having a data input terminal, a conversion circuit converting an input signal received via the data input terminal, and a decision circuit making a decision on an output of the conversion circuit, wherein the conversion circuit comprises a demultiplexer converting the input signal into a signal of a lower frequency than the frequency thereof at the data input terminal, wherein an output of the demultiplexer is obtained at the drain side of each of a plurality of first transistors having a common source.

Data input into the conversion circuit may be converted into a change in a drain current of a second transistor whose drain is connected to the common source of the plurality of first transistors, and wherein demultiplexed signals may be obtained at the drain side of the plurality of first transistors by current steering. The demultiplexer may be a differential circuit using differential-pair transistors, and wherein a current at a node to which the sources of the differential-pair transistors are commonly connected may be caused to flow in pulsed fashion, thereby operating each of the differential-pair transistors during a specific timing period and obtaining a demultiplexed signal at the drain side of the each differential-pair transistor.

The data receiving circuit may further comprise an integrating circuit which is supplied with the output of the demultiplexer, and wherein the integrating circuit may integrate 1-bit data of the input signal. The integrating circuit may integrate and accumulate temporally consecutive multiple bit data of the input signal, and the accumulated value may be obtained as a weight of sign and magnitude that differ for each bit. The data receiving circuit may further comprise an addition operation section obtaining a weighted sum of integrated results of each bit after integration for one bit is performed with the output of the demultiplexer, and wherein the decision circuit may make a decision on the result of addition operation of the weighted sum.

An output of the integrating circuit may be a current output obtained in the form of a transistor drain current, and a weighted sum may be formed by passing multiple bit output currents of the integrating circuit to a common node. The conversion circuit, which directly interfaces with the input signal, may comprise deferential-pair transistors, and wherein a drain-side load of the differential-pair transistors may be a low impedance load. The drain-side load of the deferential-pair transistors may be a resistor, a diode-connected transistor, or a gate-grounded transistor. A load for the integrating circuit may be a transistor of a polarity different from the polarity of a transistor that produces the integrated current, and wherein the data receiving circuit may further comprise an adjusting circuit adjusting a potential representing the result of the integration to an appropriate value at an intermediate level between a high-level supply voltage and a low-level supply voltage.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before proceeding to the detailed description of the preferred embodiments of the data receiving circuit according to the present invention, a prior art data receiving circuit and its associated problem will be described with reference to the drawings.

Figure 1:
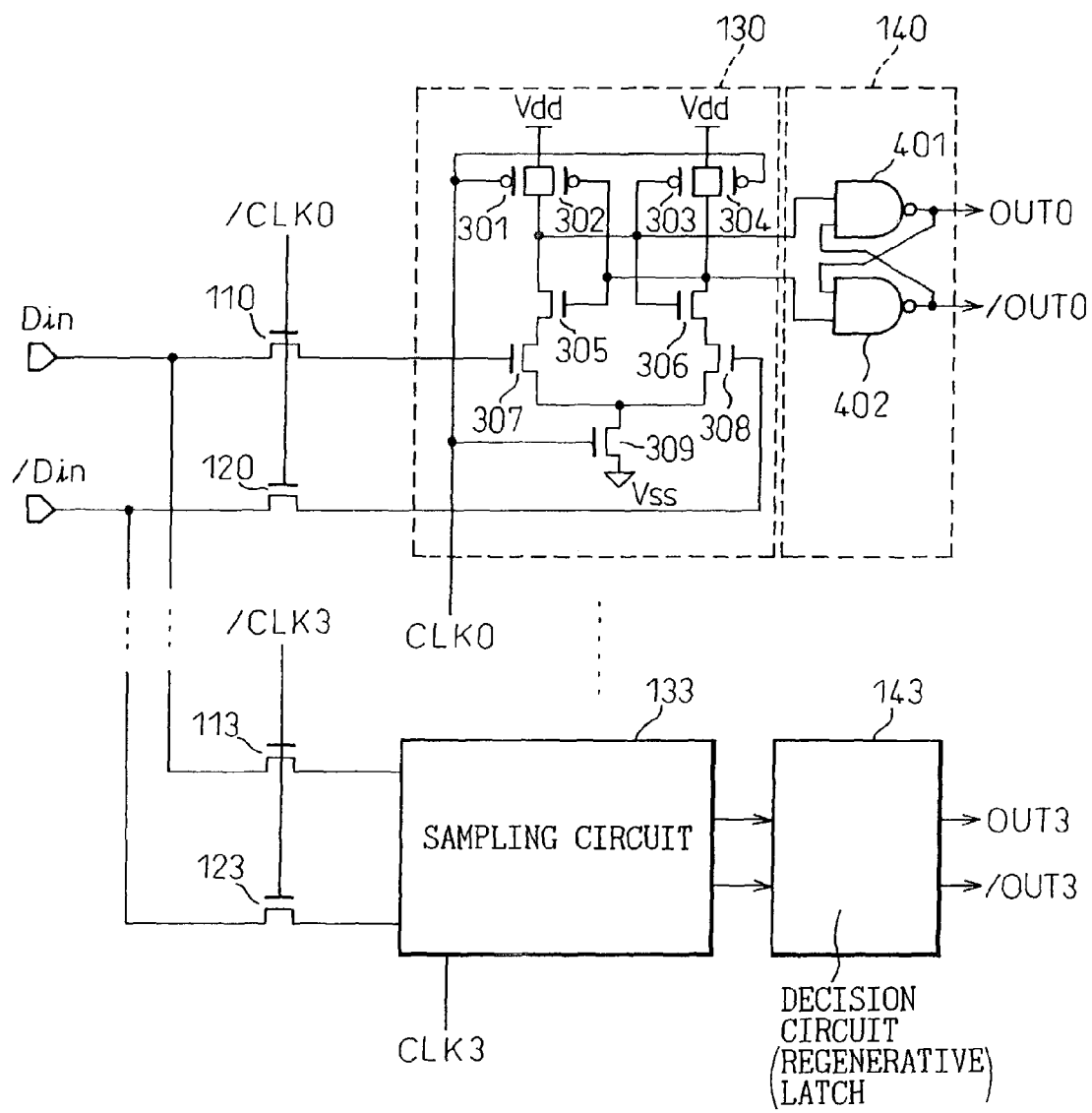
FIG. 1 is a block circuit diagram schematically showing one example of a data receiving circuit according to the prior art.
Figure 2:
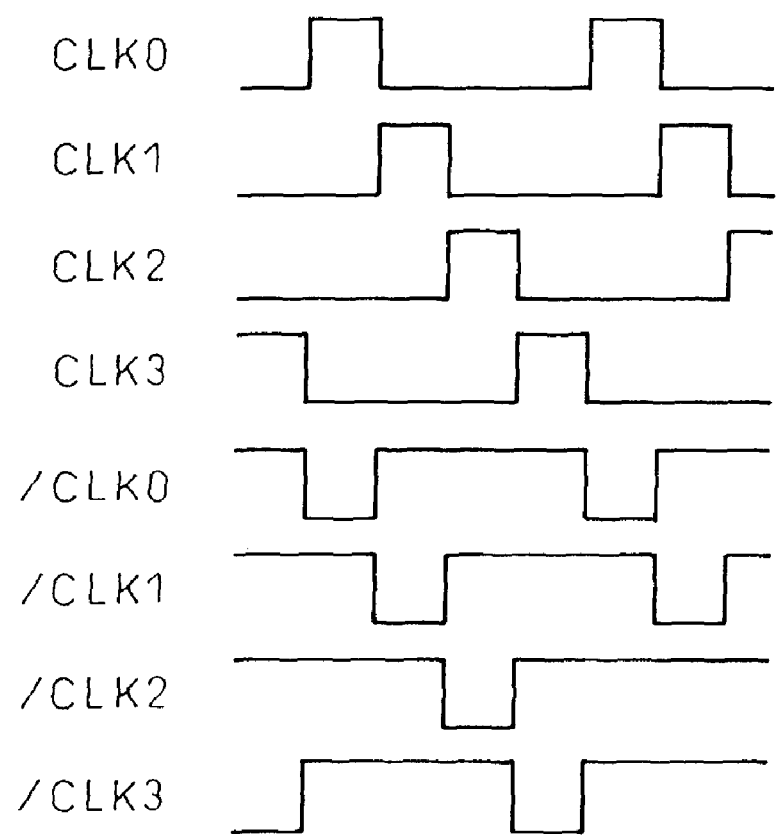
FIG. 2 is a diagram showing the timing waveforms of the clocks to be used in the data receiving circuit of FIG. 1.

FIG. 1 is a block circuit diagram schematically showing one example of the prior art data receiving circuit, and FIG. 2 is a diagram showing the timing waveforms of the clocks (internal clocks) to be used in the data receiving circuit of FIG. 1. Here, the data receiving circuit of FIG. 1 is configured as a 1:4 DEMUX (demultiplexer).

In FIG. 1, reference numerals 110 to 113 and 120 to 123 are transistor switches (n-channel MOS transistors: nMOS transistors), 130 and 133 are sampling circuits, and 140 to 143 are decision circuits (regenerative latches). That is, the data receiving circuit of FIG. 1 comprises, for example, four pairs of switches 110, 120; 111, 121; 112, 122; and 113, 123, four sampling circuits 130, 131, 132, and 133, and four decision circuits 140, 141, 142, and 143, and is driven by complementary (differential) four-phase clocks CLK0, /CLK0; CLK1, /CLK1; CLK2, /CLK2; and CLK3, /CLK3. Here, the clock /CLK0, for example, is an inverted version of the clock CLK0; the timings of these differential four-phase clocks (internal clocks) CLK0 to CLK3 and /CLK0 to /CLK3 are as shown in FIG. 2.

As shown in FIG. 1, in the prior art data receiving circuit, differential input signals Din and /Din synchronized, for example, to a 4-GHz external clock are latched via the four pairs of switches 110 to 113, 120 to 123 into the four sampling circuits 130 to 133 synchronized, for example, to 1-GHz internal clocks (CLK0 to CLK3), and differential output signals OUT0 to OUT3, /OUT0 to /OUT3 are output through the respective decision circuits 140 to 143.

Here, each sampling circuit (for example, the one indicated at 130) comprises PMOS transistors 301 to 304 and nMOS transistors 305 to 309, and receives the input signals Din and /Din at the gates of the differential-pair transistors 307 and 308 and the clock CLK0 at the gates of the transistors 301, 304, and 309. That is, for example, at the timing that the clock /CLK0 falls from high level "H" to low level "L" causing the switches 110 and 120 to turn off, and that the clock CLK0 rises from low level "L" to high level "H" causing the transistor 309 to turn on and the transistors 301 and 304 to turn off, the sampling circuit 130 latches the input signal data Din and /Din, and the data are then latched by the decision circuit 140 which is a latch comprising, for example, two NAND gates 401 and 402, to make a decision on the data.

If the speed of the data receiving circuit of FIG. 1 is to be increased, the operating speed of the DEMUX (demultiplexer), which operates at the fastest speed, must be increased, and to achieve this, the switches (transistors 110 to 113, 120 to 123) must be made to operate faster.

In the data receiving circuit of FIG. 1, the input signals Din and /Din is supplied to the sampling circuits (130 to 133) via the transistor switches 110 to 113, 120 to 123 that are driven by the internal clocks /CLK0 to /CLK3. Accordingly, for on/off operation of the switches 110 to 113 and 120 to 123, the source-gate potential of each transistor must be driven to a level higher than/lower than the threshold Vth of the transistor, and the gate potential required to operate the switch on/off varies as a function of the level of the input signal Din, /Din.

If the potential required to operate the switch on/off varies as a function of the input signal level, there can occur cases where the switch cannot be completely turned on/off, unless the amplitude of the clock used to drive the switch is made sufficiently large; furthermore, since the on/off timing of the switch is dependent on the input signal level, data-dependent jitter may occur, making correct data reception more difficult. Moreover, in high-speed data reception, the clock used is required to have a correspondingly high frequency, but the higher the clock frequency, the more difficult it becomes to achieve a large amplitude.

Next, the basic configuration of the data receiving circuit according to the present invention will be described with reference to FIGS. 3 to 5.

Figure 3:
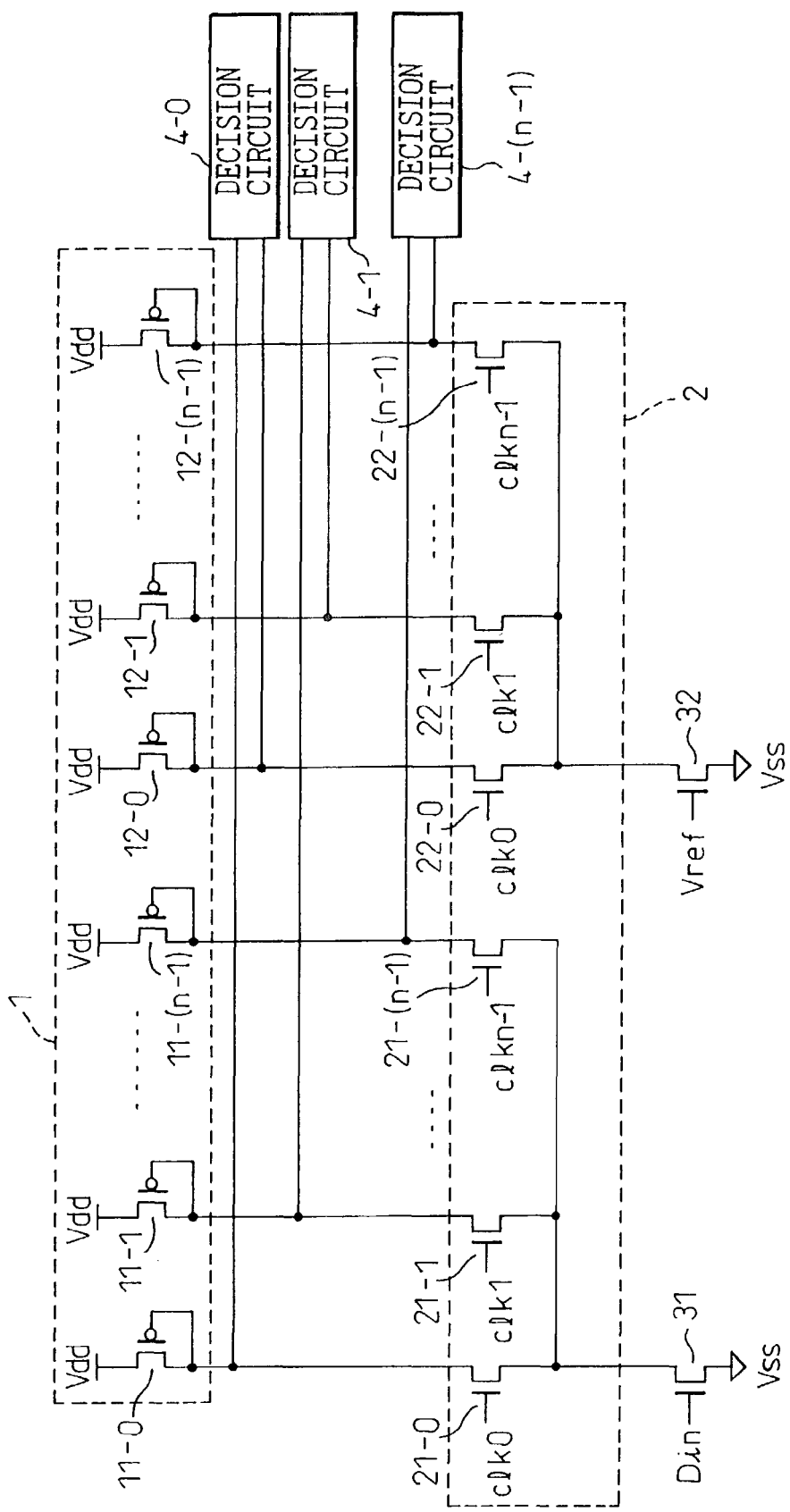
FIG. 3 is a block circuit diagram schematically showing the basic configuration of a data receiving circuit according to a first mode of the present invention.
Figure 4:
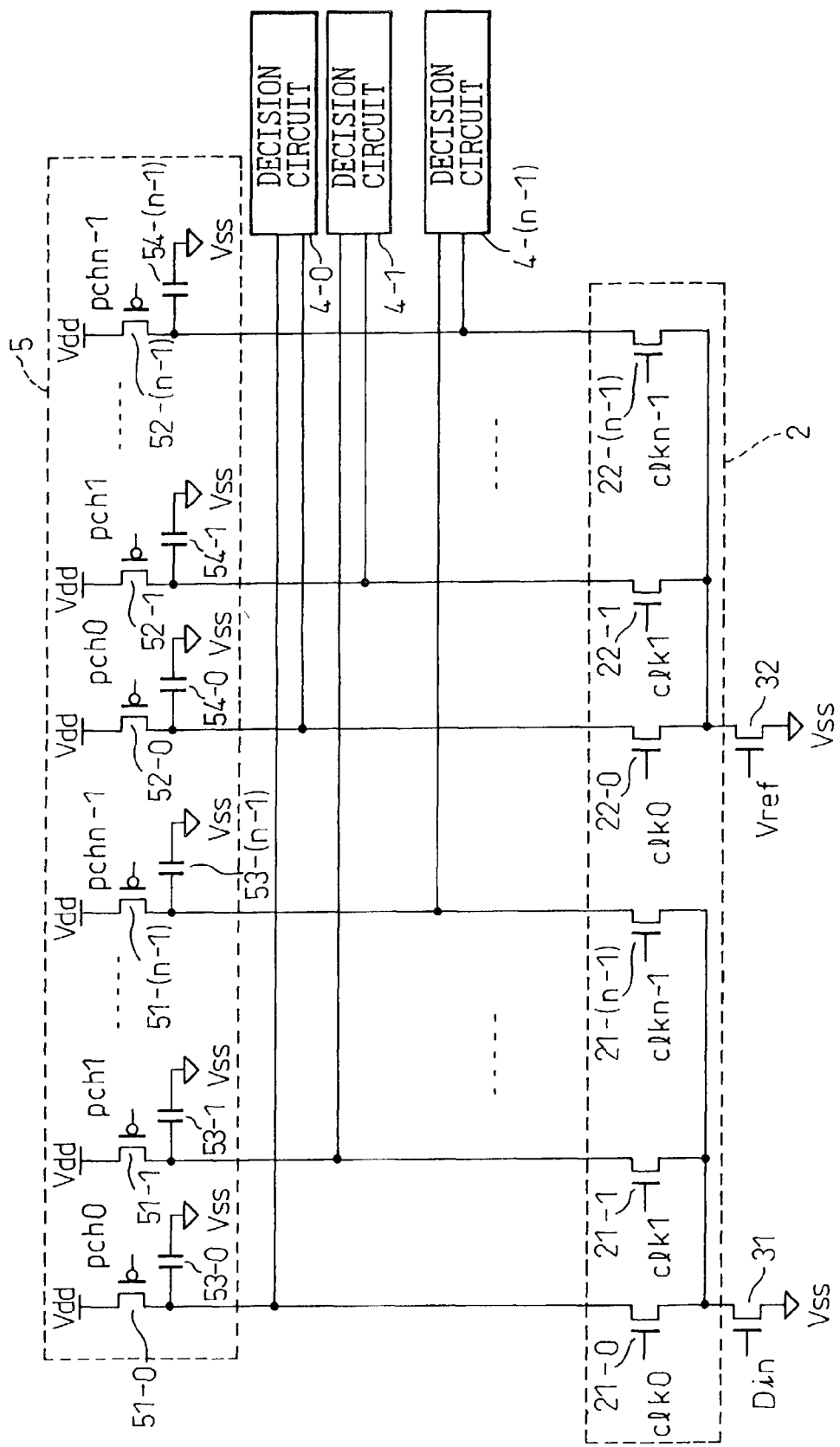
FIG. 4 is a block circuit diagram schematically showing the basic configuration of a data receiving circuit according to a second mode of the present invention.
Figure 5:
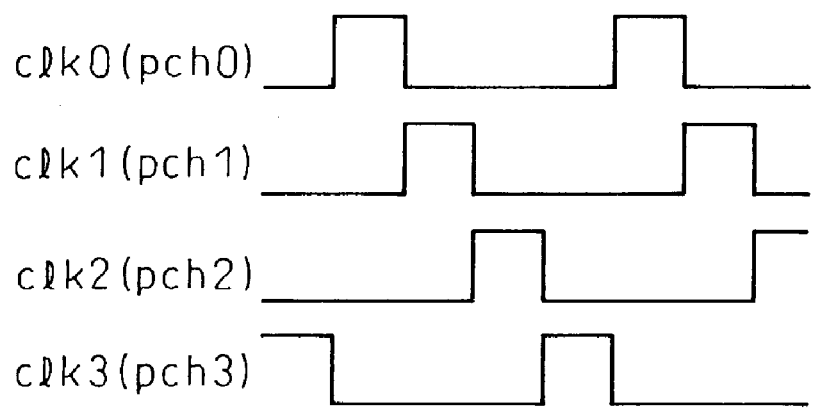
FIG. 5 is a diagram showing the timing waveforms of the clocks to be used in the data receiving circuits of FIGS. 3 and 4.

FIG. 3 is a block circuit diagram schematically showing the basic configuration of a data receiving circuit according to a first mode of the present invention, FIG. 4 is a block circuit diagram schematically showing the basic configuration of a data receiving circuit according to a second mode of the present invention, and FIG. 5 is a diagram showing the timing waveforms of the clocks to be used in the data receiving circuits of FIGS. 3 and 4. Here, the data receiving circuits shown in FIGS. 3 and 4 are each configured as a circuit that receives a single-ended input signal Din, but it will be appreciated that they can be configured as circuits that receive differential input signals (Din, /Din).

In FIG. 3, reference numeral 1 is a load circuit, 2 is a source-coupled circuit, 31 and 32 are input nMOS transistors, and 4-0 to 4-($n-1$) are decision circuits. In FIG. 4, reference numeral 5 indicates an integrating circuit (load circuit).

First, as shown in FIG. 3, the data receiving circuit according to the first mode of the present invention comprises: the load circuit 1 constructed from a plurality of diode-connected pMOS transistors 11-0 to 11-($n-1$) and 12-0 to 12-($n-1$); the source-coupled circuit 2 constructed from a plurality of nMOS transistors 21-0 to 21-($n-1$) and 22-0 to 22-($n-1$) whose gates are supplied with internal clocks clk0 to clk($n-1$), respectively; the input transistors (nMOS transistors) 31 and 32 whose gates are supplied with an input signal Din and a reference voltage Vref, respectively; and the plurality of decision circuits 4-0 to 4-($n-1$).

The n transistors (load transistors) 11-0 to 11-($n-1$) and the n transistors (switch transistors) 21-0 to 21-($n-1$) are provided for the input signal Din, while the n transistors (load transistors) 12-0 to 12-($n-1$) and the n transistors (switch transistors) 22-0 to 22-($n-1$) are provided for the reference voltage Vref. Each of the n decision circuits 4-0 to 4-($n-1$) makes a decision on the received data by taking as inputs the node connecting between the corresponding load transistor and switch transistor on the input signal side and the node connecting between the corresponding load transistor and switch transistor on the reference voltage side.

More specifically, when the data receiving circuit of FIG. 3 is configured, for example, as a 1:4 DEMUX (n=4), then the data receiving circuit comprises four decision circuits (4-0 to 4-3), four load transistors (11-0 to 11-3) and four switch transistors (21-0 to 21-3) on the input signal side, and four load transistors (12-0 to 12-3) and four switch transistors (22-0 to 22-3) on the reference voltage side. In this configuration, when the input signal Din is a signal that is input by synchronizing, for example, to a 4-GHz clock, 1-GHz four-phase clocks clk0 to clk3 spaced 90° apart in phase, such as shown in FIG. 5, are used as the internal clocks.

In this way, the data receiving circuit according to the first mode of the present invention uses the source-coupled circuit 2, constructed from the plurality of source-coupled transistors 21-0 to 21-($n-1$) and 22-0 to 22-($n-1$), as the DEMUX in the receiving circuit, and performs signal switching (input signal Din and reference voltage Vref) by using the internal clocks clk0 to clk($n-1$). That is, the input signal Din is converted by the input transistor 31 into a current which flows through one of the switch transistors 21-0 to 21-($n-1$) that is turned on in the source-coupled circuit 2 and through the corresponding one of the load transistors 11-0 to 11-($n-1$), while the reference voltage Vref is converted by the input transistor 32 into a current which flows through one of the switch transistors 22-0 to 22-($n-1$) that is turned on in the source-coupled circuit 2 and through the corresponding one of the load transistors 12-0 to 12-($n-1$). Here, one of the internal clocks clk0 to clk($n-1$) is at a high level "H" at any instant in time, so that one of the switch transistors 21-0 to 21-($n-1$) and the corresponding one of the switch transistors 22-0 to 22($n-1$) are ON.

More specifically, when the internal clock clk0, for example, is at a high level "H", the current flowing through the input transistor 31 and the switch transistor 21-0 is converted by the load transistor 11-0 into a voltage level corresponding to the input signal Din, while the current flowing through the input transistor 32 and the switch transistor 22-0 is converted by the load transistor 12-0 into a voltage level corresponding to the reference voltage Vref. That is, the voltage level corresponding to the input signal Din applied to the gate of the input transistor 31 and the voltage level corresponding to the reference voltage Vref applied to the gate of the input transistor 32 appear at the node between the load transistor 11-0 and the switch transistor 21-0 and the node between the load transistor 12-0 and the switch transistor 22-0, respectively, by current steering, and these signals (voltages) are supplied to the decision circuit 4-0 which thus makes a decision on the input signal data Din.

In the above-described data receiving circuit according to the first mode of the present invention, a decision is made on the input signal (Din) data at the rising edge of each clock (each of the internal clocks clk0 to clk(n−1)); as there is a setup and hold relationship between the data and the clock, the aperture time is short. Therefore, ideally, adjustment must be made so that the rising edge of the clock will occur at the center of the data eye, and if the decision timing matches, highly accurate data reception can be achieved. However, for example, when the data eye is very small, the timing accuracy of the clock becomes a problem, that is, if the timing accuracy is not good enough, the data decision becomes susceptible to high frequency noise, and care should be taken about this point.

Next, as is apparent from a comparison between FIG. 4 and FIG. 3, in the data receiving circuit according to the second mode of the present invention, the load circuit 1 in the data receiving circuit of FIG. 3 is configured as an integrating circuit (load circuit) 5. That is, in the above-described data receiving circuit according to the first mode of the present invention, the load circuit 1 is constructed from the plurality of diode-connected pMOS transistors 11-0 to 11-(n−1) and 12-0 to 12-(n−1); on the other hand, as shown in FIG. 4, in the data receiving circuit according to the second mode of the present invention, the integrating circuit 5 is constructed from a plurality of integrating units using a plurality of pMOS transistors 51-0 to 51-(n−1) and 52-0 to 52-(n−1) whose gates are supplied with control signals and a plurality of capacitors 53-0 to 53-(n−1) and 54-0 to 54-(n−1).

More specifically, when the data receiving circuit of FIG. 4 is configured, for example, as a 1:4 DEMUX (n=4), then the integrating circuit 5 comprises four PMOS transistors (51-0 to 51-3) on the input signal side, four pMOS transistors (52-0 to 52-3) on the reference voltage side, four capacitors (53-0 to 53-3) on the input signal side, and four capacitors (54-0 to 54-3) on the reference voltage side. In this example, the control signals (pch0 to pch3) supplied to the gates of the pMOS transistors (51-0 to 51-3 and 52-0 to 52-3) on the input signal side and on the reference voltage side, respectively, are the same as the internal clocks (clk0 to clk3), i.e., four-phase clocks spaced 90° apart in phase, as shown in FIG. 5.

The data receiving circuit according to the second mode of the present invention, just like the data receiving circuit according to the first mode of the present invention, uses the source-coupled circuit 2, constructed from the plurality of source-coupled transistors 21-0 to 21-(n−1) and 22-0 to 22-(n−1), as the DEMUX in the receiving circuit, and performs signal switching (input signal Din and reference voltage Vref) by using the internal clocks clk0 to clk(n−1). When one of the internal clocks clk0 to clk(n−1) (for example, the internal clock clk0) is at the high level "H", the PMOS transistors 51-0 to 51-(n−1) and 52-0 to 52-(n−1) in the integrating circuit 5 are all ON, except those (PMOS transistors 51-0 and 52-0) supplied with the control signal (pch0) that goes to the high level "H" when that one internal clock (clk0) goes to the high level "H"; in this case, a high-level supply voltage Vdd is applied through the pMOS transistors (51-1 to 51-(n−1) and 52-1 to 52-(n−1)) to the respective capacitors (53-1 to 53-(n−1) and 54-1 to 54-(n−1)) to store charges thereon. At this time, the switch transistors 21-1 to 21-(n−1) and 22-1 to 22-(n−1) corresponding to the pMOS transistors 51-1 to 51-(n−1) and 52-1 to 52-(n−1) that are turned on with their gates supplied with the low level "L" control signals pch1 to pch(n−1) are supplied at their gates with the low level "L" internal clocks clk1 to clk(n−1), respectively, so that these switch transistors 21-1 to 21-(n−1) and 22-1 to 22-(n−1) are OFF.

On the other hand, the pMOS transistors 51-0 and 52-0 that are supplied at their gates with the high level "H" control signal pch0 are OFF, while the switch transistors 21-0 and 22-0 that are supplied at their gates with the corresponding internal clock clk0 are ON. As a result, the charge stored on the capacitor 53-0 is drawn through the ON switch transistor 21-0 into the low-level power supply Vss side by the input transistor 31 whose gate is supplied with the input signal Din, while the charge stored on the capacitor 54-0 is drawn through the ON switch transistor 22-0 into the low-level power supply Vss side by the input transistor 32 whose gate is supplied with the reference voltage Vref. Here, as the currents that flow through the input transistors 31 and 32 are determined according to the levels of the input signal Din and reference voltage Vref, respectively, the voltage level corresponding to the input signal Din appears at the node between the capacitor 53-0 (PMOS transistor 51-0) and the switch transistor 21-0, while the voltage level corresponding to the reference voltage Vref appears at the node between the capacitor 54-0 (pMOS transistor 52-0) and the switch transistor 22-0. That is, the input signal Din applied to the gate of the input transistor 31 and the reference voltage Vref applied to the gate of the input transistor 32 appear at the node between the capacitor 53-0 and the switch transistor 21-0 and the node between the capacitor 54-0 and the switch transistor 22-0, respectively, by current steering, and these signals (voltages) are supplied to the decision circuit 4-0 which thus makes a decision on the input signal data Din.

In the above-described data receiving circuit according to the second mode of the present invention, a decision is made on the input signal (Din) data by the high level "H" of each clock (each of the internal clocks clk0 to clk(n−1)); as the concept of setup and hold times does not apply here, the aperture time is long. Therefore, if the integrating timing matches, a low S/N ratio can be achieved. However, the integrating circuit, for example, is resistant to high frequency noise but is sensitive to jitter and low frequency noise, and care should be taken about this point.

As described above, according to the data receiving circuit of the present invention, as the DEMUX operation of the receiving circuit can be achieved by the current steering of the switch transistors (source-coupled transistors), the need for a large amplitude clock can be eliminated. Furthermore, as the switch transistors are controlled by the internal clocks without depending on the level of the input signal, input amplitude dependent jitter does not occur.

It will also be noted that, as the outputs of the DEMUX used in the data receiving circuit of the present invention are obtained as transistor drain currents, the integration can also be performed over 1 UI (Unit Interval) in order to increase the output amplitude of the DEMUX. That is, by thus performing the integration, a large signal gain can be obtained by the integration, and since the integration has the effect of attenuating high-frequency noise, the S/N ratio can be improved.

Various embodiments of the data receiving circuit according to the present invention will be described in detail below with reference to the accompanying drawings.

Figure 6:
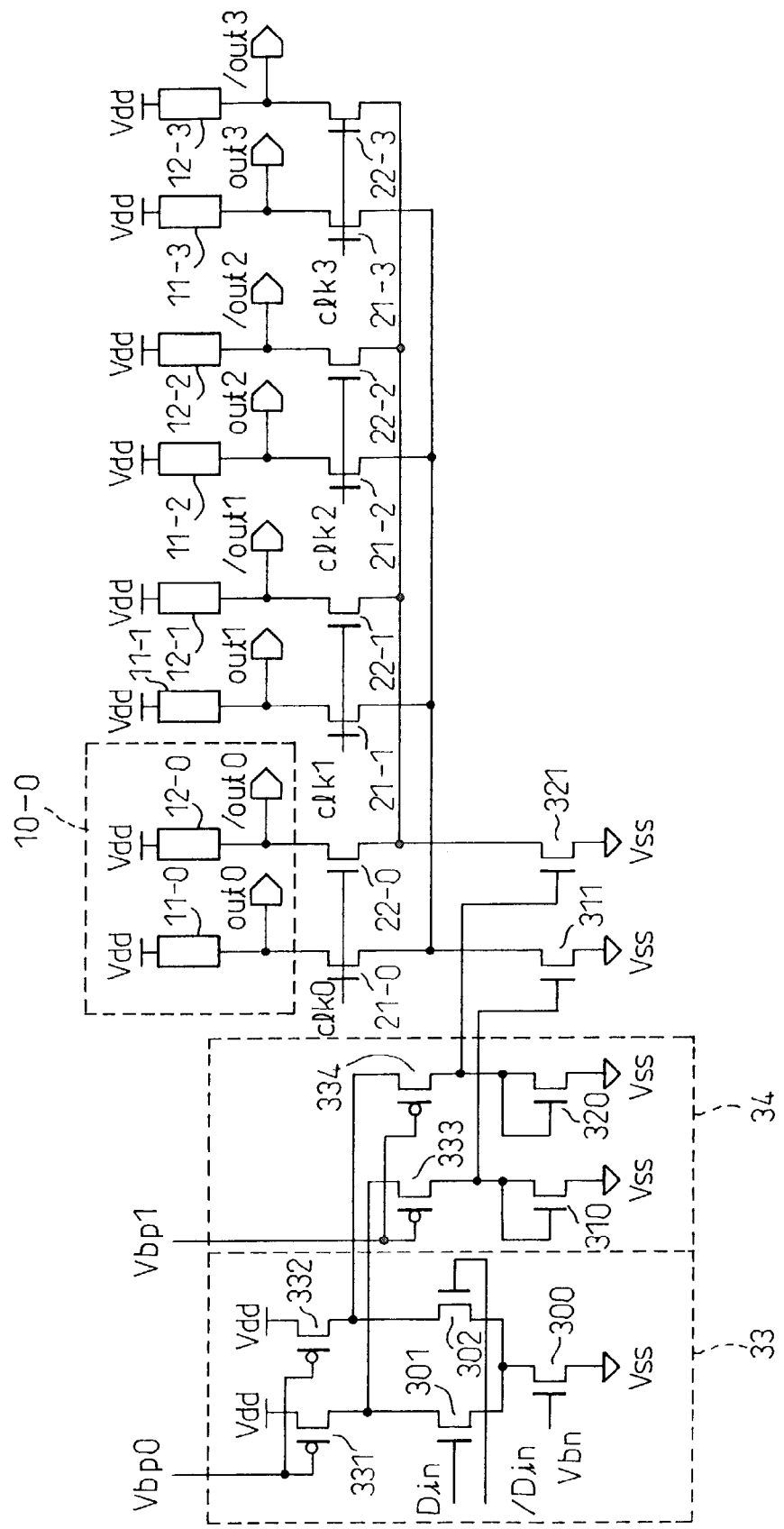
FIG. 6 is a block circuit diagram showing a first embodiment of the data receiving circuit according to the present invention.

FIG. 6 is a block circuit diagram showing a first embodiment of the data receiving circuit according to the present invention. In FIG. 6, reference numeral 33 is a transconductor section, 34 is a folded cascode section, and 11-0 to 11-3 and 12-0 to 12-3 are loads. Further, reference numerals 21-0 to 21-3 and 22-0 to 22-3 are switching transistors, and 311 and 321 are nMOS transistors.

As shown in FIG. 6, the data receiving circuit of the first embodiment comprises the transconductor section 33, which is supplied with differential input signals Din and /Din and performs a voltage-to-current conversion on the input signals, and the folded cascode section 34, which receives the outputs of the transconductor section 33 and converts them into currents for diode-connected nMOS transistors.

The transconductor section 33 comprises pMOS transistors 331 and 332 whose gates are supplied with a bias voltage Vbp0, nMOS transistors 301 and 302 whose gates are supplied with the respective input signals Din and /Din, and an nMOS transistor 300 whose gate is supplied with a bias voltage Vbn. The folded cascode section 34 comprises pMOS transistors 333 and 334, whose gates are supplied with a bias voltage Vbp1, and diode-connected nMOS transistors 310 and 320, and converts the outputs (the node between the transistors 331 and 301 and the node between the transistors 332 and 302) of the transconductor section 33 into currents for the transistors 310 and 320. The transistors 310 and 320 are respectively connected to the nMOS transistors 311 and 321 in a current mirror configuration, so that the currents in the transistors 310 and 320 are converted into currents for the transistors 311 and 321, respectively.

The loads 11-0 to 11-3 and 12-0 to 12-3 and the switch transistors 21-0 to 21-3 and 22-0 to 22-3 correspond to the load transistors and switch transistors in the data receiving circuit previously shown in FIG. 3 when n=4. In the data receiving circuit shown in FIG. 6, the decision circuits (4-0 to 4-3) in the data receiving circuit of FIG. 3 are omitted. In FIG. 6, the loads 11-0 and 12-0, for example, constitute a load circuit 10-0.

Figure 7:
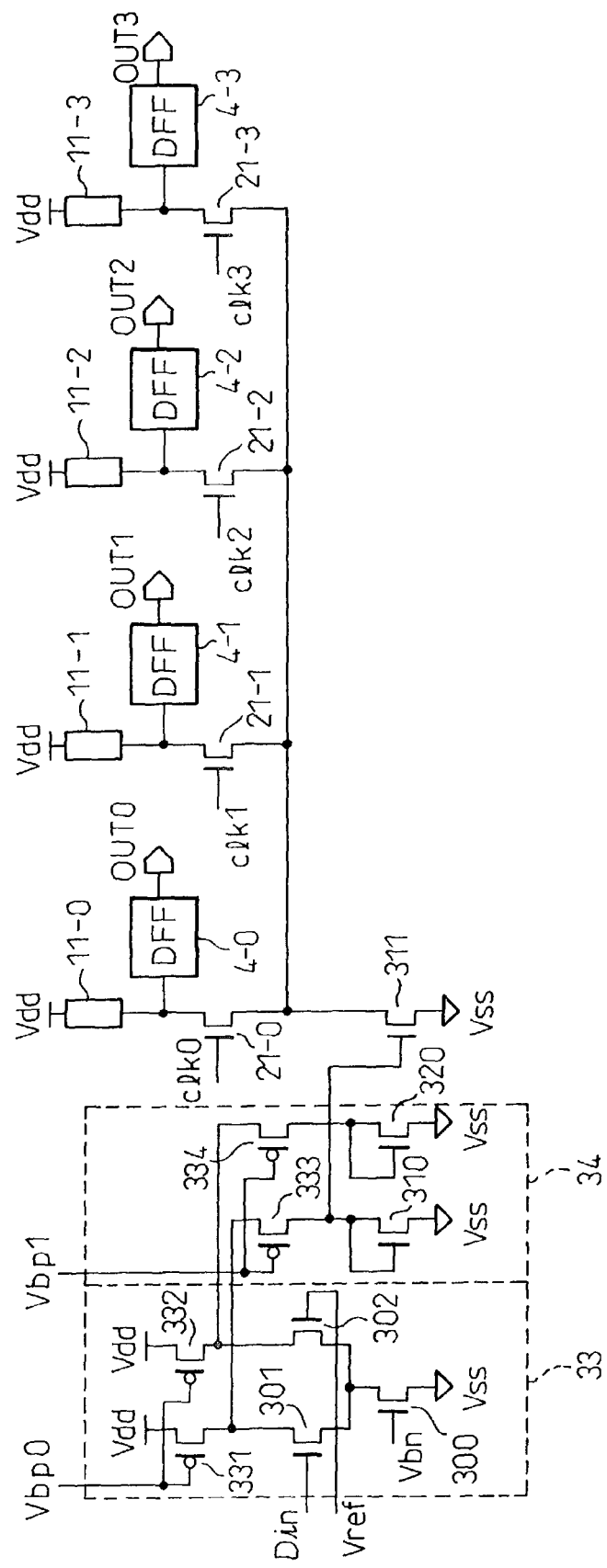
FIG. 7 is a block circuit diagram showing a second embodiment of the data receiving circuit according to the present invention.

FIG. 7 is a block circuit diagram showing a second embodiment of the data receiving circuit according to the present invention; in this embodiment, the differential data receiving circuit shown in FIG. 6 is reconfigured as a single-ended circuit.

As is apparent from a comparison between FIG. 7 and FIG. 6, in the data receiving circuit of the second embodiment shown in FIG. 7, the gate of the transistor 302 in the transconductor section 33 is supplied with a reference voltage Vref instead of the inverted logic input signal /Din. Further, in accordance with the single-ended configuration, only one transistor 310 in the folded cascode section 34 is connected to form a current mirror with the transistor 311, and outputs OUT0 to OUT3 are produced through the load 11-0 to 11-3, switch transistors 21-0 to 21-3, and D-type flip-flops (DFFS) 4-0 to 4-3. Though the data decision circuits are omitted in the data receiving circuit of the foregoing first embodiment, the DFFs 4-0 to 4-3 as data decision circuits are shown in the data receiving circuits of the second embodiment shown in FIG. 7.

Because of the use of a differential transconductor for converting a signal voltage to a current, as described above, each of the above embodiments has the advantage that a wide input common-mode range can be obtained. In each of the above embodiments, the transconductor (33, 34) of a folded cascode structure has been used to convert the signal voltage to a current, but it will be appreciated that various other configurations can be used to achieve the same purpose.

Figure 8:
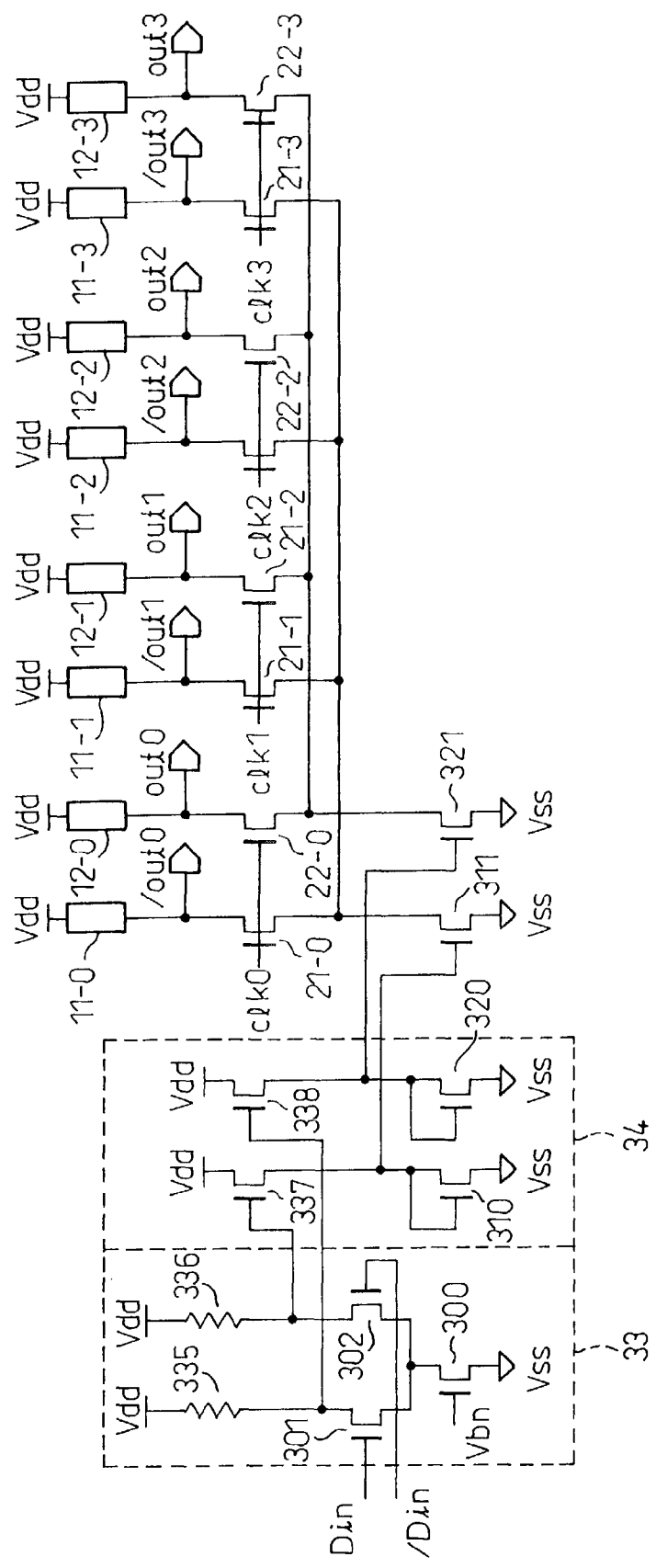
FIG. 8 is a block circuit diagram showing a third embodiment of the data receiving circuit according to the present invention.

FIG. 8 is a block circuit diagram showing a third embodiment of the data receiving circuit according to the present invention.

As is apparent from a comparison between FIG. 8 and FIG. 6, in the data receiving circuit of the third embodiment shown in FIG. 8, the PMOS transistors 331 and 332 in the transconductor section 33 in the first embodiment of FIG. 6 are replaced by resistors 335 and 336, and the pMOS transistors 333 and 334 in the folded cascode section 34 are replaced by nMOS transistors 337 and 338.

That is, in the data receiving circuit of the third embodiment, the input signals Din and /Din are received by the differential pair (301, 302) of the resistive loads (335 and 336), and the voltages of the resistive loads are coupled to the nMOS diode loads (310 and 320) through the nMOS source followers (337 and 338). By using the nMOS source followers in this way, the third embodiment has the advantage of improving the driving speed of the diode loads and thus achieving a higher-speed operation.

Figure 9:
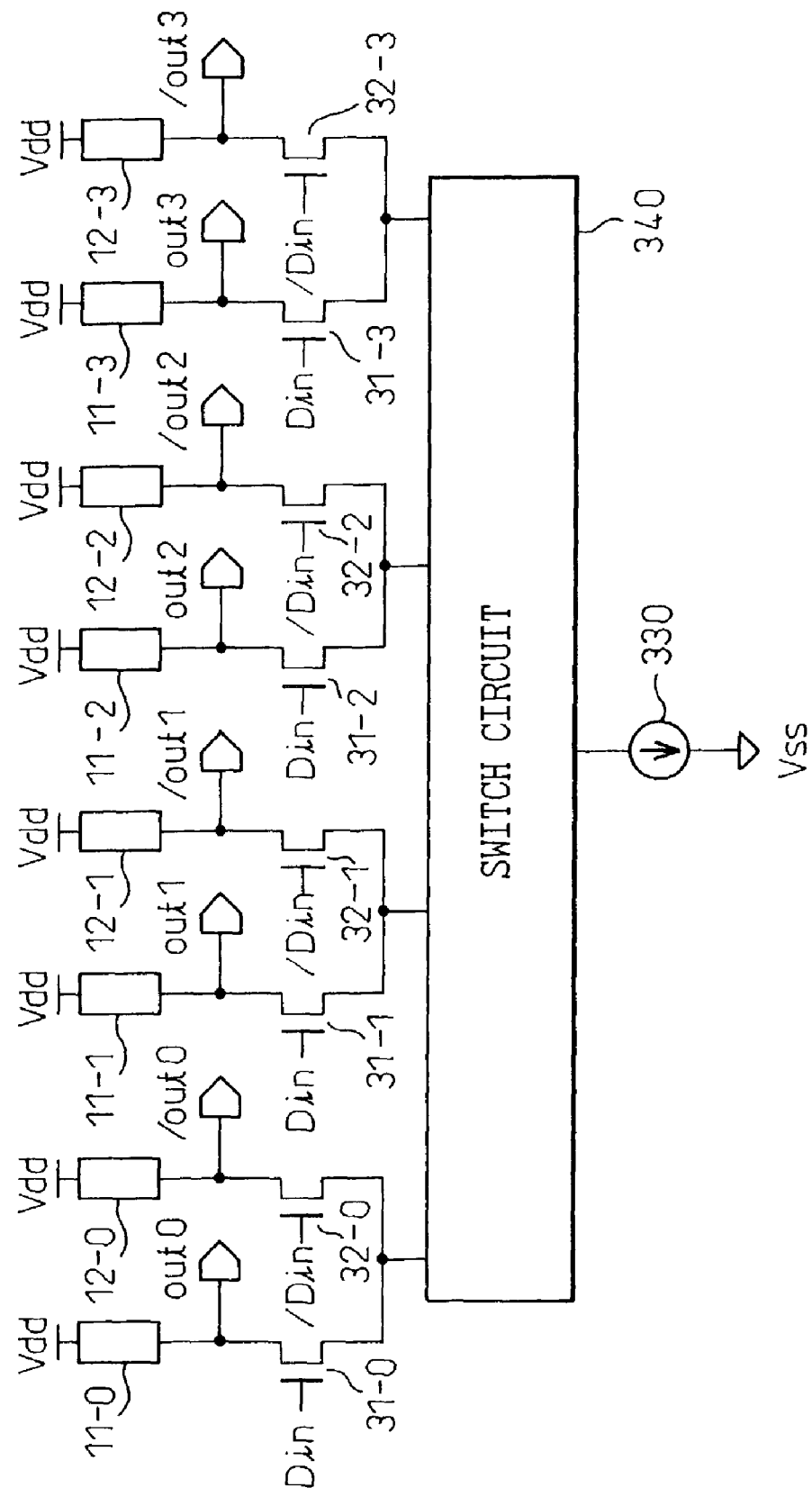
FIG. 9 is a block circuit diagram showing a fourth embodiment of the data receiving circuit according to the present invention.

FIG. 9 is a block circuit diagram showing a fourth embodiment of the data receiving circuit according to the present invention.

As shown in FIG. 9, in the data receiving circuit of the fourth embodiment, the DEMUX is constructed from four differential pairs (31-0, 32-0 to 31-3, 32-3), and the sampling and demultiplexing of the input signals Din and /Din are performed by sequentially selecting one of the four differential pairs via a switch circuit 340.

Figure 10:
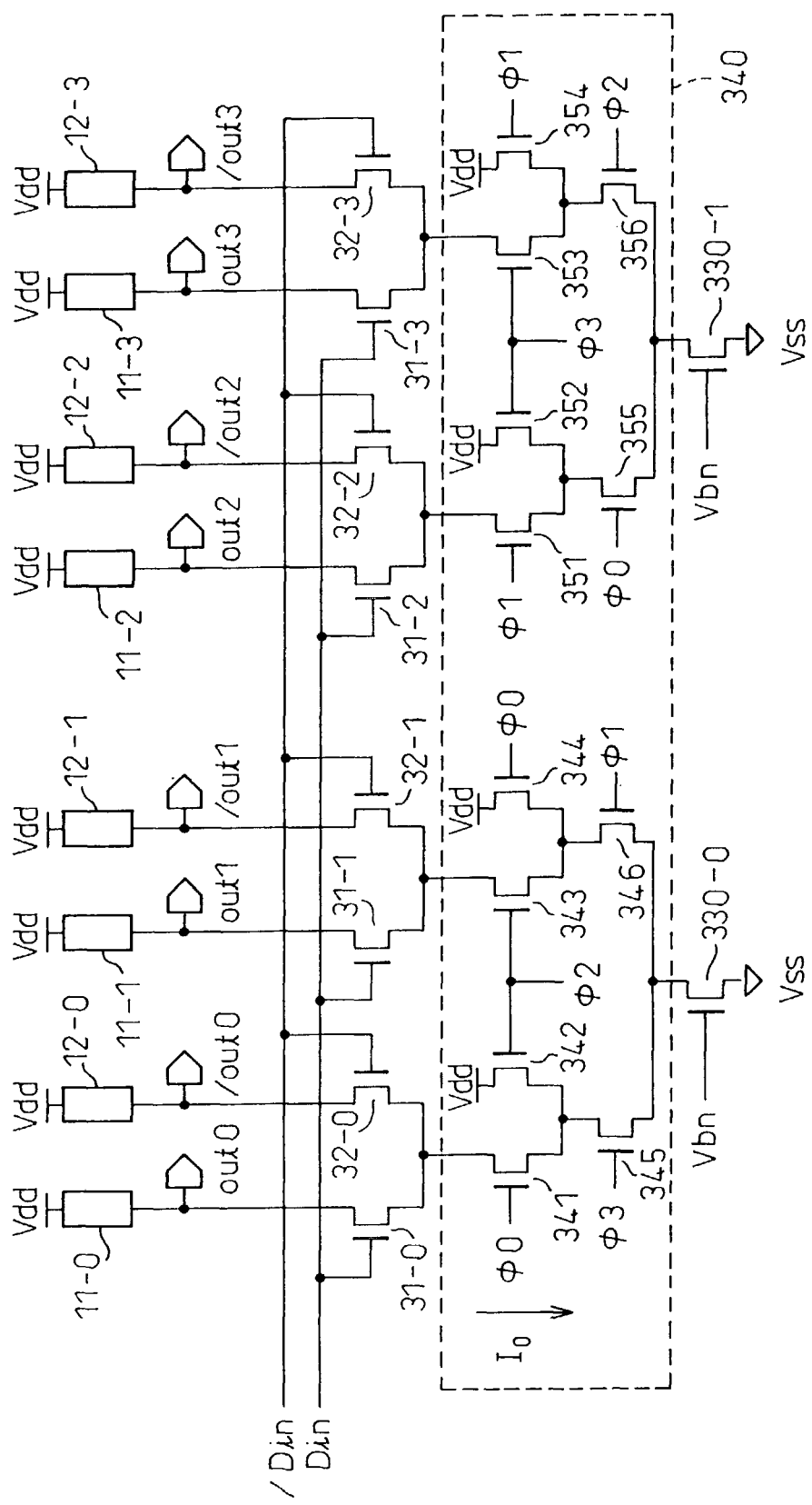
FIG. 10 is a block circuit diagram showing a fifth embodiment of the data receiving circuit according to the present invention.
Figure 11:
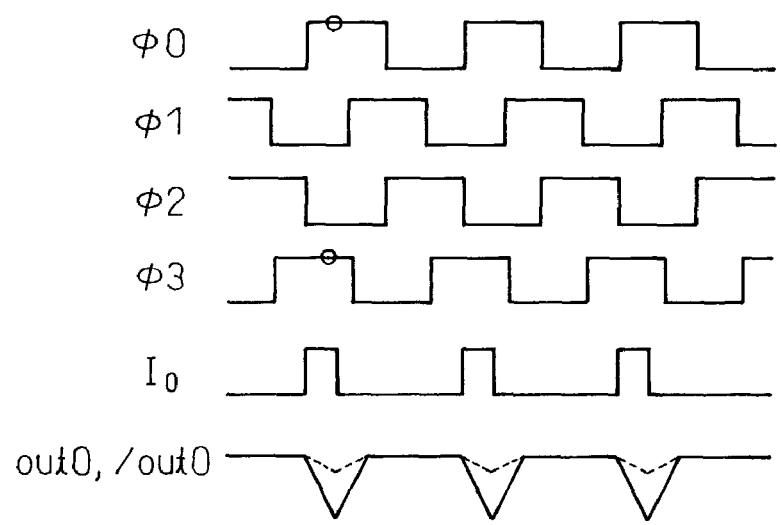
FIG. 11 is a diagram for explaining the operation of the data receiving circuit shown in FIG. 10.

FIG. 10 is a block circuit diagram showing a fifth embodiment of the data receiving circuit according to the present invention, and FIG. 11 is a diagram for explaining the operation of the data receiving circuit shown in FIG. 10.

As shown in FIG. 10, in the fifth embodiment, the switch circuit 340 comprises nMOS transistors 341 to 346 and 351 to 356, and a predetermined one of four-phase clocks (control signals) $\phi 0$ to $\phi 3$ spaced 90° apart in phase is supplied to the gate of each transistor, thereby sequentially selecting one of the four differential pairs 31-0, 32-0; 31-1, 32-1; 31-2, 32-2; and 31-3, 32-3.

More specifically, during the period that the clocks $\phi 0$ and $\phi 3$ are both at a high level "H" (at this time, the clock $\phi 2$ is at a low level "L"), for example, the transistors 341 and 345 are both ON (at this time, the transistor 342 is OFF), so that the differential pair 310, 32-0 is selected and the current $I_0$ flows through the transistors 341, 345, and 330-0. Here, the other differential pairs 31-1, 32-1 to 31-3, 32-3 are deselected, as one of the transistors leading to the low-level power supply line (Vss) is OFF so that a current path is not formed.

That is, the current $I_0$ is divided between the transistors 31-0 and 32-0 according to the levels of the input signals Din and /Din supplied to the gates of the differential pair 31-0, 32-0, and signals (out0 and /out0) of the levels corresponding to the input signals Din and /Din appear at the node between the load 11-0 and the transistors 31-0 and the node between the load 12-0 and the transistors 32-0, respectively. Here, the nMOS transistors 330-0 and 330-1 whose gates are supplied with the bias voltage Vbn function as current sources.

Figure 12:
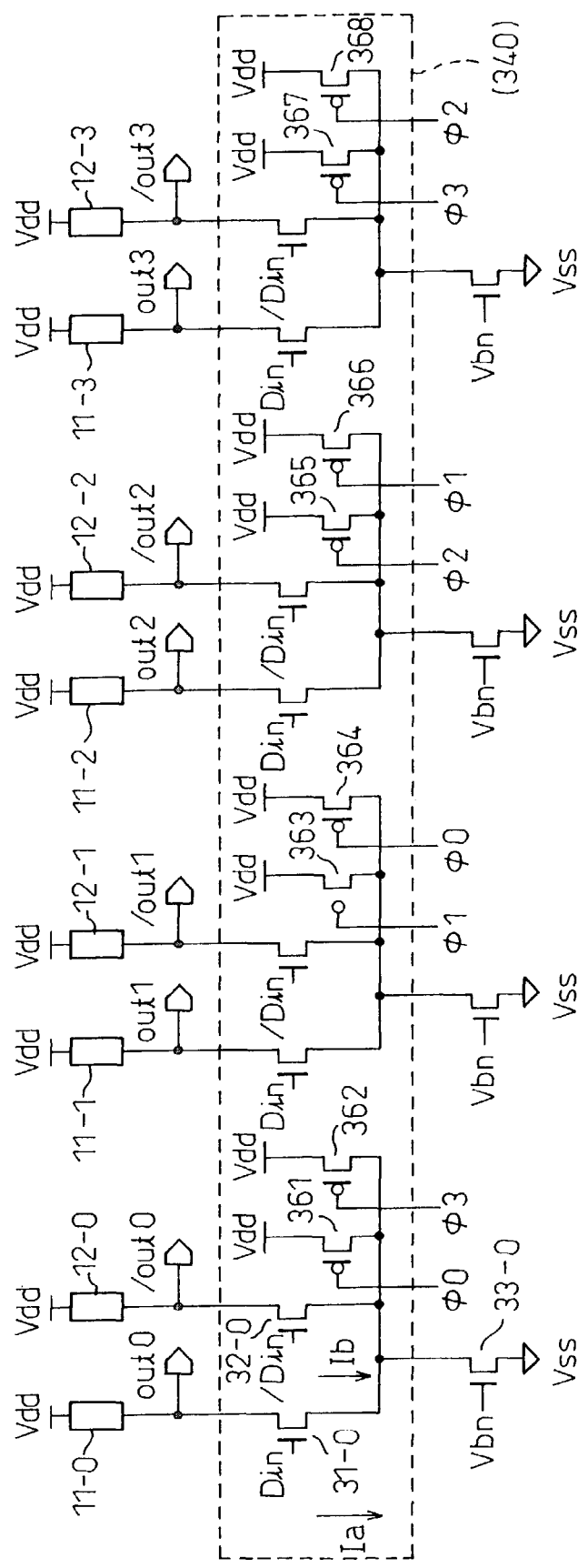
FIG. 12 is a block circuit diagram showing a sixth embodiment of the data receiving circuit according to the present invention.
Figure 13:
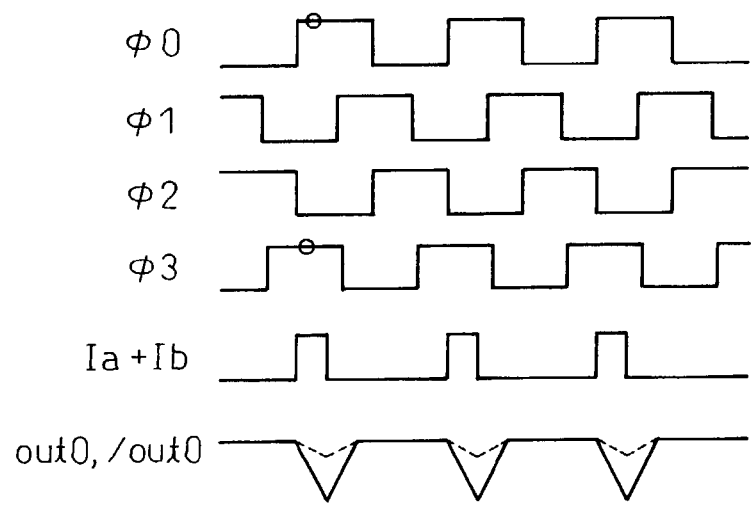
FIG. 13 is a diagram for explaining the operation of the data receiving circuit shown in FIG. 12.

FIG. 12 is a block circuit diagram showing a sixth embodiment of the data receiving circuit according to the present invention, and FIG. 13 is a diagram for explaining the operation of the data receiving circuit shown in FIG. 12.

As shown in FIG. 12, in the sixth embodiment, the switch circuit 340 comprises PMOS transistors 361 to 368, and a predetermined one of four-phase clocks (control signals) $\phi 0$ to $\phi 3$ spaced 90° apart in phase is supplied to the gate of each transistor, thereby sequentially selecting one of the four differential pairs 31-0, 32-0; 31-1, 32-1; 31-2, 32-2; and 31-3, 32-3.

More specifically, during the period that the clocks $\phi 0$ and $\phi 3$ are both at a high level "H", for example, the transistors 361 and 362 are OFF, so that the differential pair 31-0, 32-0 is selected. Here, the other differential pairs 31-1, 32-1 to 31-3, 32-3 are deactivated (deselected), as one of the pMOS transistors leading to the high-level power supply line (Vdd) is ON so that the current flows directly through the ON transistor.

That is, the currents Ia and Ib flowing through the differential-pair transistors 31-0 and 32-0, corresponding to the levels of the input signals Din and /Din, flow through the transistor 33-0, and signals (out0 and /out0) of the levels corresponding to the input signals Din and /Din appear at the node between the load 11-0 and the transistors 31-0 and the node between the load 12-0 and the transistors 32-0, respectively. Here, the nMOS transistors 33-0 to 33-3 whose gates are supplied with the bias voltage Vbn function as current sources.

Figure 14:
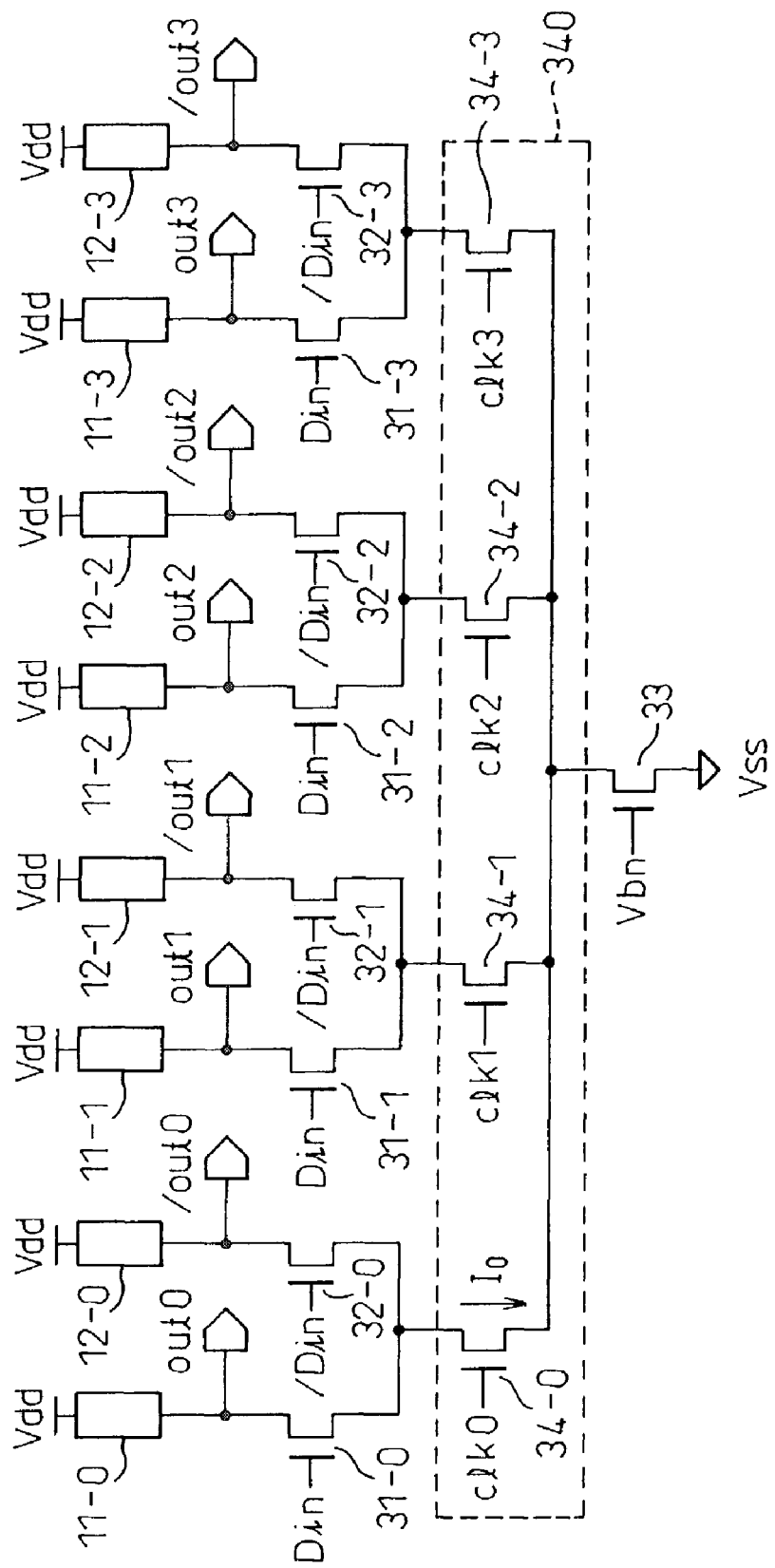
FIG. 14 is a block circuit diagram showing a seventh embodiment of the data receiving circuit according to the present invention.
Figure 15:
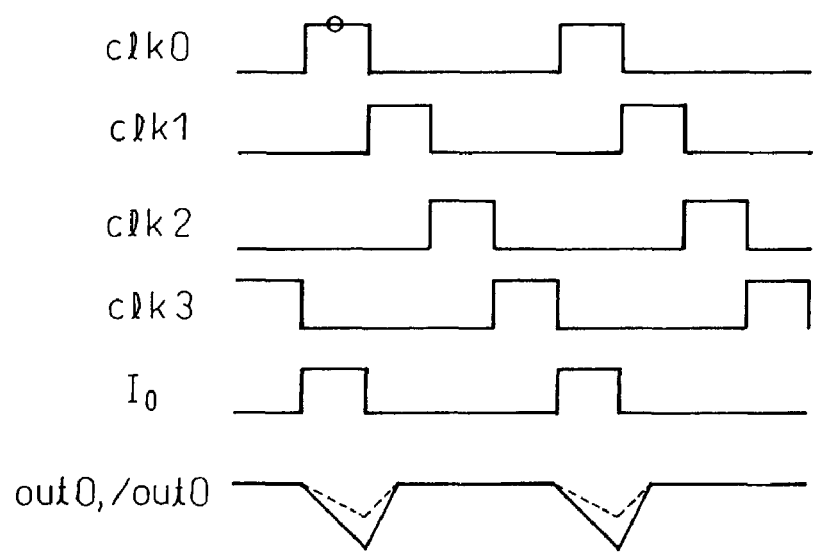
FIG. 15 is a diagram for explaining the operation of the data receiving circuit shown in FIG. 14.

FIG. 14 is a block circuit diagram showing a seventh embodiment of the data receiving circuit according to the present invention, and FIG. 15 is a diagram for explaining the operation of the data receiving circuit shown in FIG. 14.

As shown in FIG. 14, in the seventh embodiment, the switch circuit 340 comprises nMOS transistors 34-0 to 34-3, and a predetermined one of four-phase clocks (control signals) clk0 to clk3, spaced 90° apart in phase with each clock having a duty ratio of 25% (high "H" for only one quarter of one clock cycle), is supplied to the gate of each transistor, thereby sequentially selecting one of the four differential pairs 31-0, 32-0; 31-1, 32-1; 31-2, 32-2; and 31-3, 32-3.

More specifically, during the period that the clock φ0 is at a high level "H", for example, the transistor 34-0 is ON, so that the differential pair 31-0, 32-0 is selected. Here, the other differential pairs 31-1, 32-1 to 31-3, 32-3 are deselected, as each transistor leading to the low-level power supply line (Vss) is OFF so that a current path is not formed.

That is, as in the earlier described fifth embodiment, the current $I_0$ is divided between the transistors 31-0 and 32-0 according to the levels of the input signals Din and /Din supplied to the gates of the differential pair 31-0, 32-0, and signals (out0 and /out0) of the levels corresponding to the input signals Din and /Din appear at the node between the load 11-0 and the transistors 31-0 and the node between the load 12-0 and the transistors 32-0, respectively. Here, the nMOS transistor 33 whose gate is supplied with the bias voltage Vbn functions as a current source.

In the fourth to seventh embodiments of the present invention described above, the switch circuit 340 has the DEMUX function as well as the function of converting the signal voltage to a current, and the current output is converted to a slower frequency through the DEMUX. This offers the advantage of being able to alleviate the requirement of the voltage-to-current conversion speed.

Figure 16:
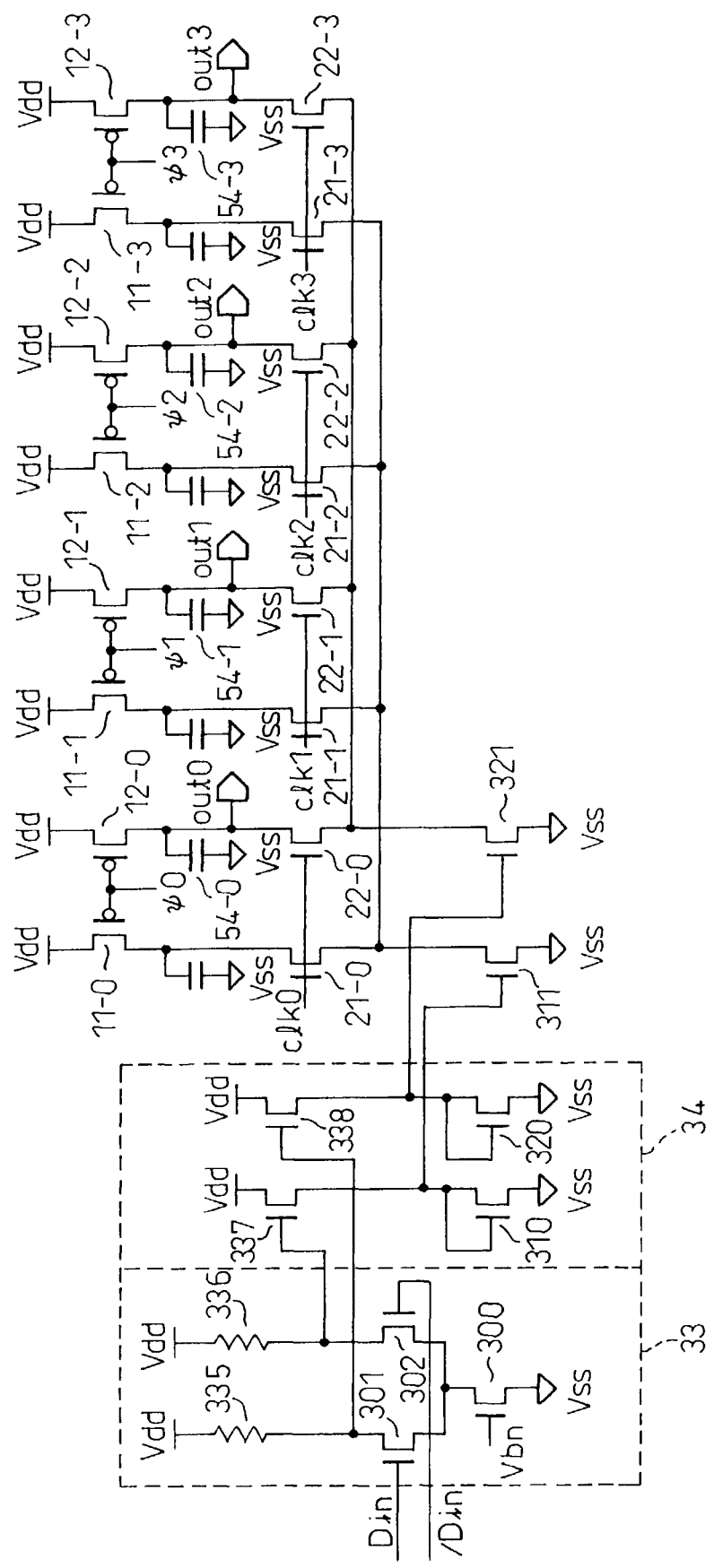
FIG. 16 is a block circuit diagram showing an eighth embodiment of the data receiving circuit according to the present invention.
Figure 17:
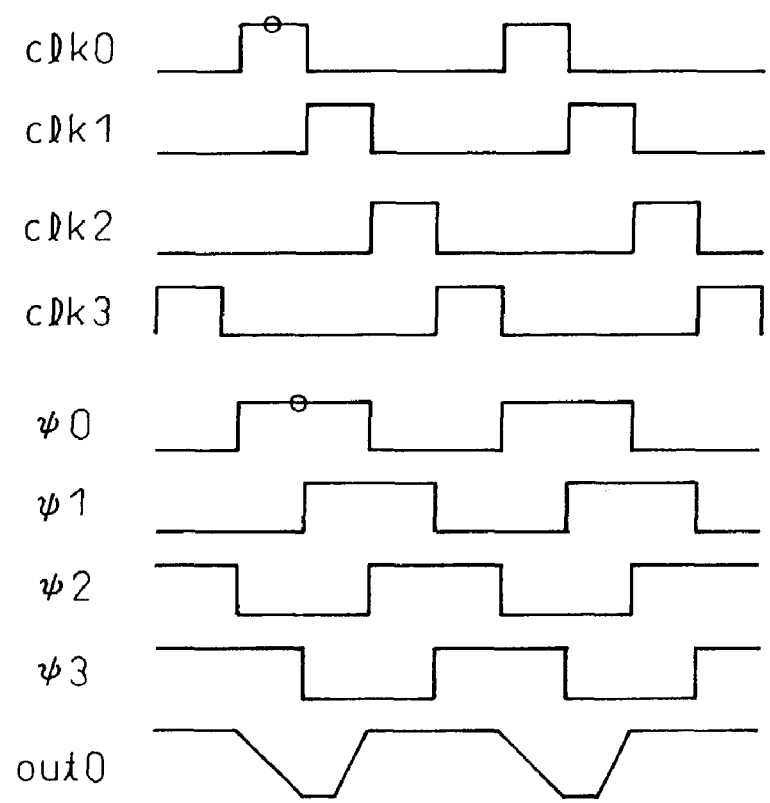
FIG. 17 is a diagram for explaining the operation of the data receiving circuit shown in FIG. 16.

FIG. 16 is a block circuit diagram showing an eighth embodiment of the data receiving circuit according to the present invention, and FIG. 17 is a diagram for explaining the operation of the data receiving circuit shown in FIG. 16.

As is apparent from a comparison between FIG. 16 and FIG. 8, the data receiving circuit of the eighth embodiment shown in FIG. 16 uses a DEMUX similar to the one used in the third embodiment of FIG. 8. The difference is that, in the eighth embodiment, the output of the DEMUX is not just an amplifier circuit, but is an integrating circuit having a reset transistor, and when the integrating circuit is not performing the integration, the output is taken single-endedly.

That is, as shown in FIG. 16, in the data receiving circuit of the eighth embodiment, control signals (four-phase clocks spaced 90° apart in phase with each clock having a duty ratio of 50%) ψ0 to ψ3 are supplied to the gates of the pMOS transistor loads 11-0 to 11-3 and 12-0 to 12-3, respectively, while four-phase clocks (control signals) clk0 to clk3, spaced 90° apart in phase with each clock having a duty ratio of 25%, are supplied to the gates of the transistors (switch transistors) 21-0 to 21-3 and 22-0 to 22-3.

More specifically, during the period that the clock clk0 is at a high level "H", for example, the transistors 21-0 and 22-0 are ON. At this time, the clock ψ0 goes to the high level "H", so that the transistors 11-0 and 12-0 are OFF, and the integration by the capacitor 54-0 is initiated to integrate the current from the DEMUX (transistor 22-0).

On the other hand, when the integrating circuit is not performing the integration, the transistor 12-0 (11-0) is turned on by the low level "L" clock ψ0 supplied to its gate, thus performing the reset operation, and the voltage of the output out0 is precharged to Vdd. Here, the integration is performed for 1 bit period (1 UI) and, when the integration is completed, the reset operation is performed again.

Since the eighth embodiment uses the integrating circuit, a high gain can be obtained for the case of a signal in which the same symbol appears in succession for the period of 1 UI and, as the integration is performed over the period of 1 UI, high-frequency noise is attenuated. That is, according to the eighth embodiment, the S/N ratio for signal reception can be improved, and the reception sensitivity can be enhanced as the signal output increases.

Figure 18:
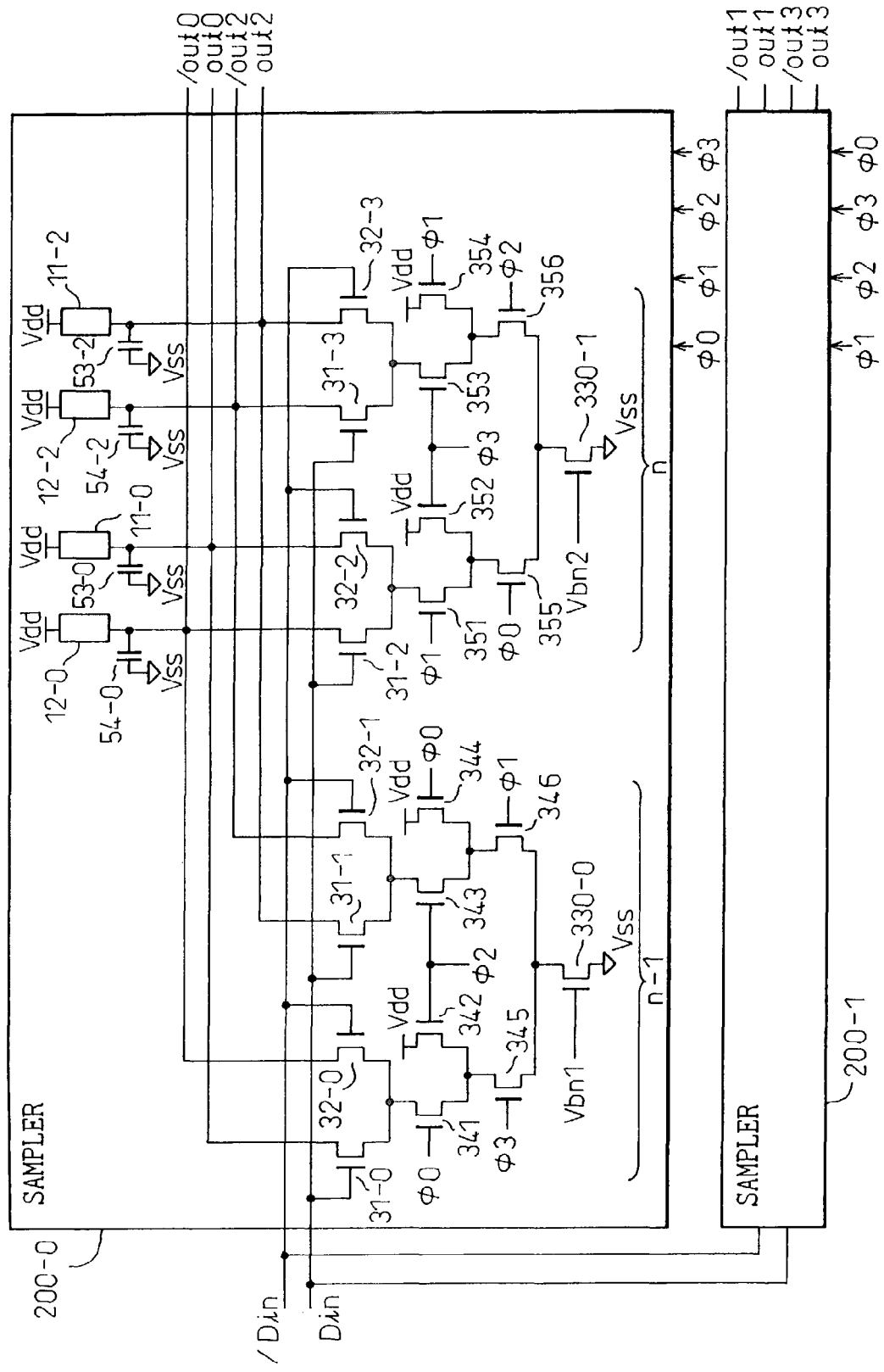
FIG. 18 is a block circuit diagram showing a ninth embodiment of the data receiving circuit according to the present invention.

FIG. 18 is a block circuit diagram showing a ninth embodiment of the data receiving circuit according to the present invention.

As shown in FIG. 18, the data receiving circuit of the ninth embodiment comprises two samplers 200-0 and 200-1, and input signals Din and /Din and four-phase clocks (control signals) φ0 to φ3 are supplied to the two samplers to produce outputs out0, /out0; out2, /out2 and out1, /out1; out3, /out3, respectively, while reducing the effects of intersymbol interference between consecutive bit ((n−1)th and n-th) data. Here, the control signals (clocks) φ0 to φ3 are four-phase clocks spaced 90° apart in phase with each clock having a duty ratio of 50%, as shown in FIG. 11.

As is apparent from a comparison between FIG. 18 and FIG. 10, in the ninth embodiment, each sampler (200-0) is configured as a DEMUX similar to the one shown in the fifth embodiment of FIG. 10 (four differential pairs 31-0, 32-0 to 31-3, 32-3 and switch circuit 340), and produces the outputs out0, /out0 and out2, /out2. Here, the transistors 31-0, 32-0, 31-1, 32-1, 341 to 346, and 330-0, for example, are for receiving the (n−1)th bit data in the input signals Din and /Din, while the transistors 31-2, 32-2, 31-3, 32-3, 351 to 356, and 330-1 are for receiving the n-th bit data in the input signals Din and /Din.

Then, by adjusting the ratio between the bias voltage Vbn1 applied to the gate of the transistor 330-0 and the bias voltage Vbn2 applied to the gate of the transistor 330-1, the outputs of the two differential pairs (31-0, 32-0; 31-1, 32-1 and transistors 31-2, 32-2; 31-3, 32-3) corresponding to the two consecutive ((n−1)th and n-th) bits are weighted, and the weighted outputs are input to the common integrating circuit (transistors 120, 11-0; 12-2, 11-2 and capacitors 54-0, 53-0; 54-2, 53-2) to obtain a signal corresponding to a weighted sum of (the integrated values of) the consecutive two bit signals. According to the data receiving circuit of the ninth embodiment, there is offered the advantage of compensating for the attenuation of high-frequency signal components.

Figure 19:
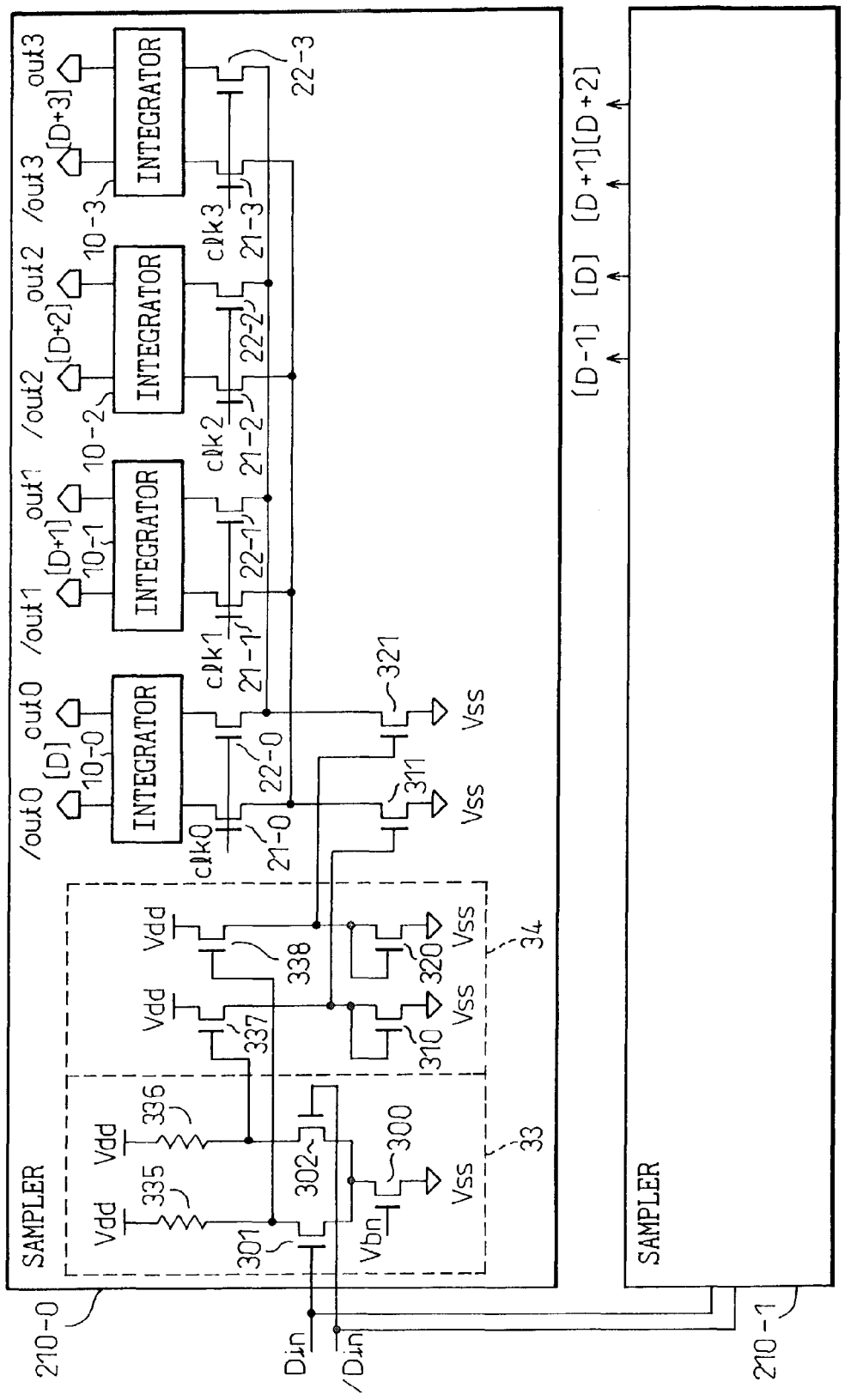
FIG. 19 is a block circuit diagram (part 1) showing a 10th embodiment of the data receiving circuit according to the present invention.
Figure 20:
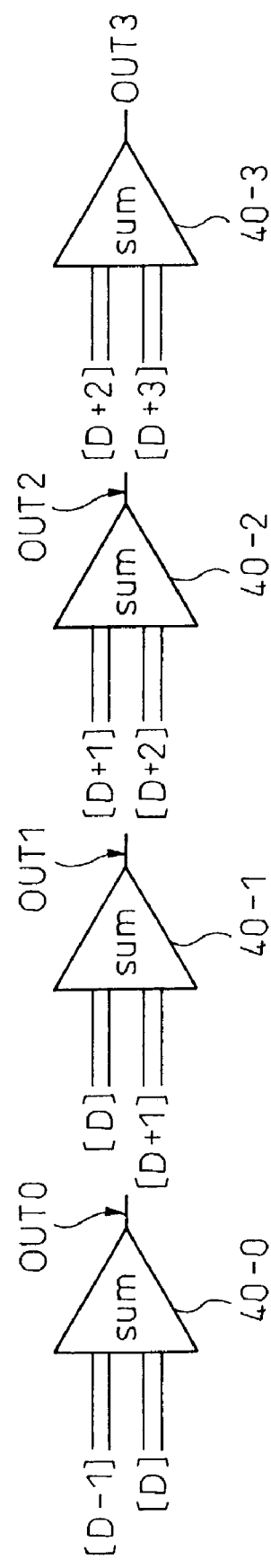
FIG. 20 is a block circuit diagram (part 2) showing the 10th embodiment of the data receiving circuit according to the present invention.
Figure 21:
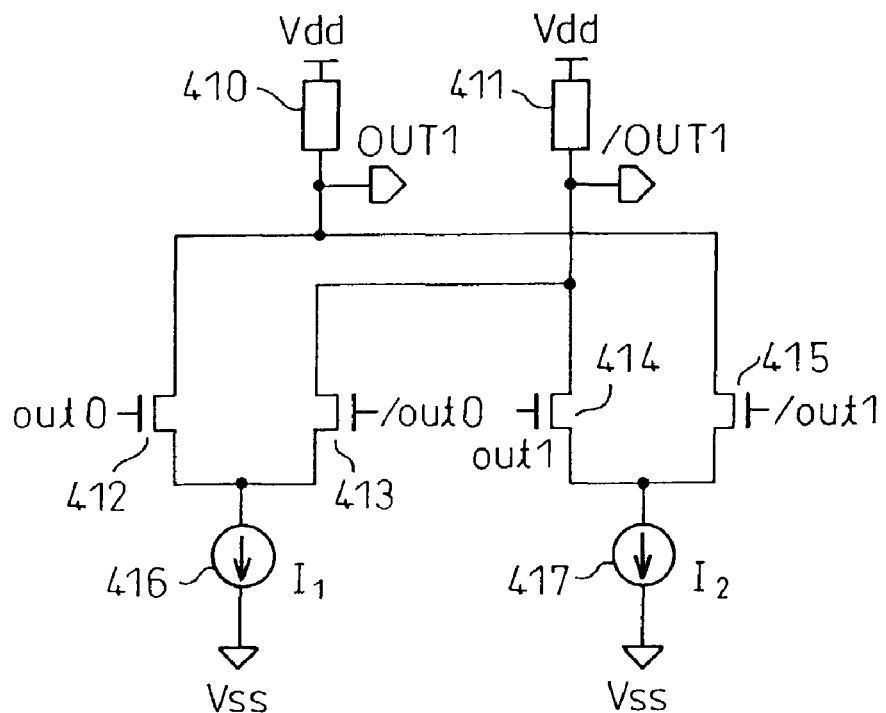
FIG. 21 is a circuit diagram showing one example of a sum amplifier shown in FIG. 20.

FIGS. 19 and 20 are block circuit diagrams showing a 10th embodiment of the data receiving circuit according to the present invention, and FIG. 21 is a circuit diagram showing one example of a sum amplifier shown in FIG. 21.

Unlike the data receiving circuit of the ninth embodiment shown in FIG. 18 in which two consecutive bit signals are weighted and integrated by the common integrating circuit (integrator), the data receiving circuit of the 10th embodiment includes integrating circuits corresponding to the respective bits, as shown in FIG. 19. Here, the integrating circuits 10-0 to 103 comprise, for example, transistors 11-0, 12-0 to 11-3 to 12-3, respectively.

As shown in FIG. 19, the data receiving circuit of the 10th embodiment comprises two samplers 210-0 and 2101, and input signals Din and /Din and four-phase clocks clk0 to clk3 are supplied to the two samplers which respectively output data [D], [D+1], [D+2], [D+3] and data [D−1], [D], [D+1], [D+2] spaced one bit apart. Then, as shown in FIG. 20, the outputs [D], [D+1], [D+2], and [D+3] of the sampler 210-0 and the outputs [D−1], [D], [D+1], and [D+2] of the sampler 210-1 are supplied to the respective sum amplifiers 40-0, 40-1, 40-2, and 40-3, and the resulting weighted sums are output as outputs OUT0, OUT1, OUT2, and OUT3.

FIG. 21 is a circuit diagram showing one example of the sum amplifier 40-1 (40-0, 40-2, 40-3) shown in FIG. 20.

The sum amplifier 40-1, which comprises integrating circuits 410 and 411, transistors 412 to 415 (two differential pairs), and current sources 416 and 417, as shown in FIG. 21, receives two consecutive bit data, i.e., the output out0, /out0: [D] of the sampler 210-1 and the output out1, /out1 [D+1] of the sampler 210-0, and forms a weighted sum which is output as OUT1, /OUT1. Here, the currents $I_1$ and $I_2$ flowing through the current source 416 and 417 respectively correspond to the currents flowing through the transistors 330-0 and 330-1 previously shown in FIG. 18 and, by adjusting the currents $I_1$ and $I_2$, the output is produced while reducing the effects of intersymbol interference between the consecutive bit ((n−1) th and n-th) data in each of the sum amplifiers 40-0 to 40-3.

According to the data receiving circuit of the 10th embodiment, not only can the attenuation of high-frequency components be compensated for, as in the foregoing ninth embodiment, but, as the weighted sum is formed after integrating, there is also offered the advantage of being able to optimally select the dynamic range of each individual integrating circuit, thus achieving the construction of a receiving circuit having a wide dynamic range of input signal amplitude.

Figure 22:
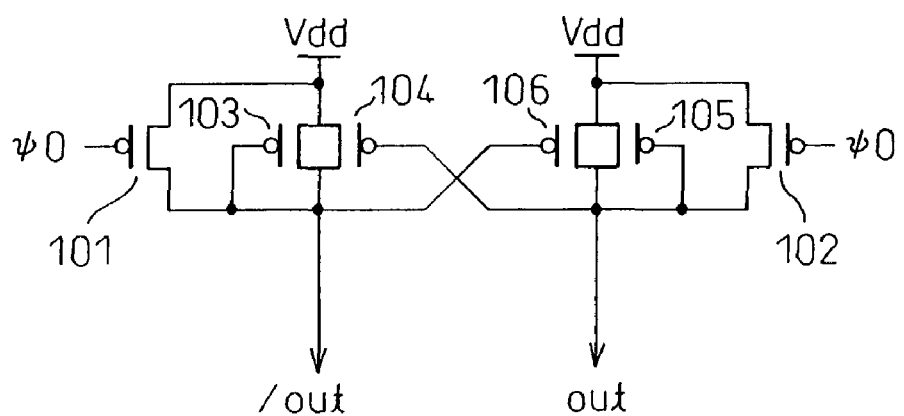
FIG. 22 is a circuit diagram showing an essential portion of an 11th embodiment of the data receiving circuit according to the present invention.

FIG. 22 is a circuit diagram showing an essential portion of an 11th embodiment of the data receiving circuit according to the present invention; one example of the integrating circuit 10-0 to 10-3 as shown, for example, in FIG. 19 is illustrated here.

As shown in FIG. 22, the integrating circuit 10-0 is configured as a current-mode integrating circuit comprising, for example, pMOS transistors 101 to 106, and the result of the integration is obtained as the drain current (out0, /out0) of a source-grounded pMOS transistor. Here, the transistors 101 and 102 are supplied at their gates with a control signal (clock) ψ3, and function as precharge (reset) devices for the integrating circuit. Other than the integrating circuits 10-0 to 10-3, the same configuration as that of the data receiving circuit shown, for example, in FIG. 19 can be employed.

In this way, according to the data receiving circuit of the 11th embodiment, as the current mode is used, integration providing a large dynamic range can be achieved, and since the integrating circuit is of the current output type, the weighted sum as the output of the integrating circuit, such as shown in FIG. 19, can be easily achieved.

Figure 23:
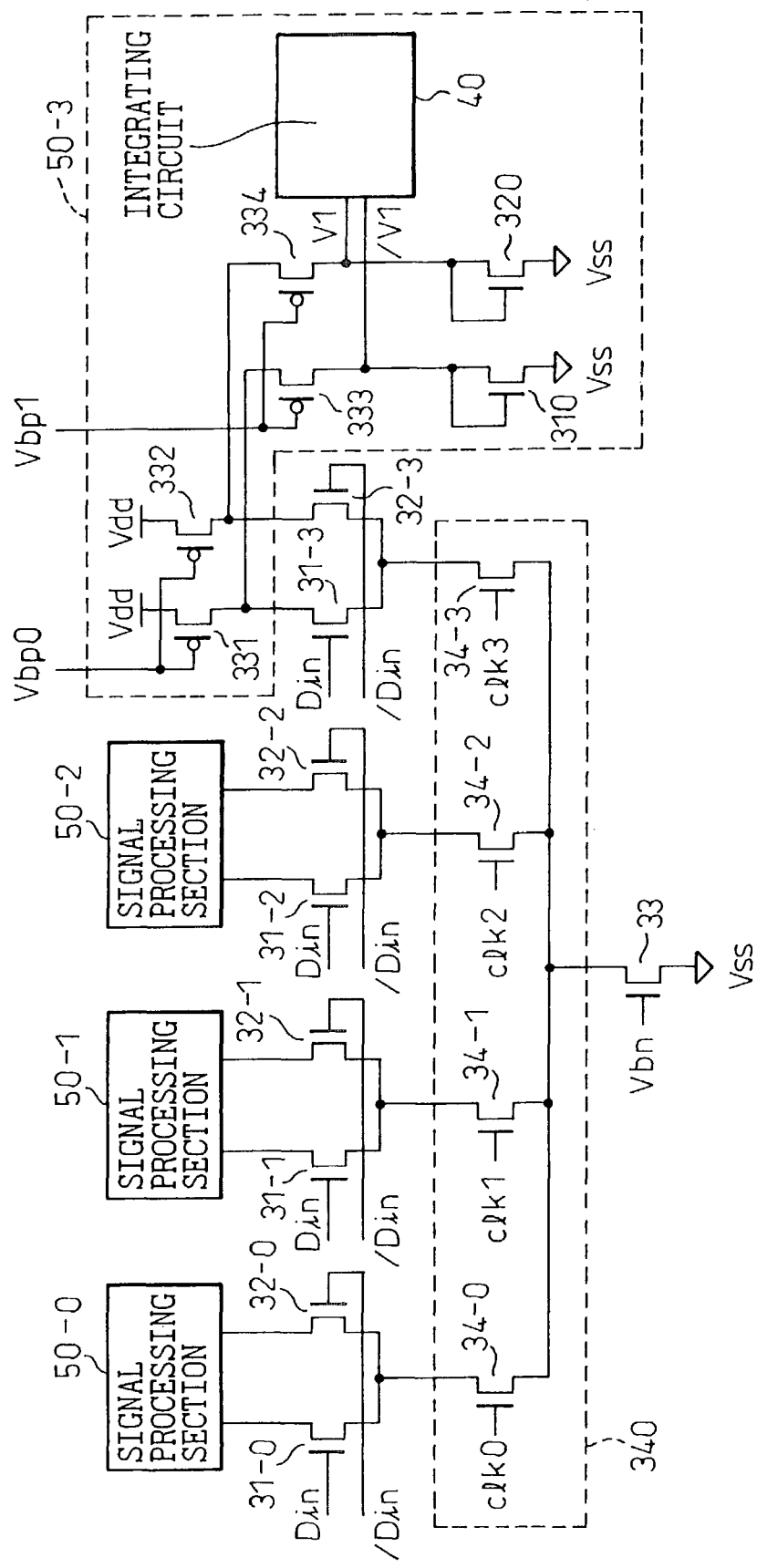
FIG. 23 is a block circuit diagram (part 1) showing a 12th embodiment of the data receiving circuit according to the present invention.
Figure 24:
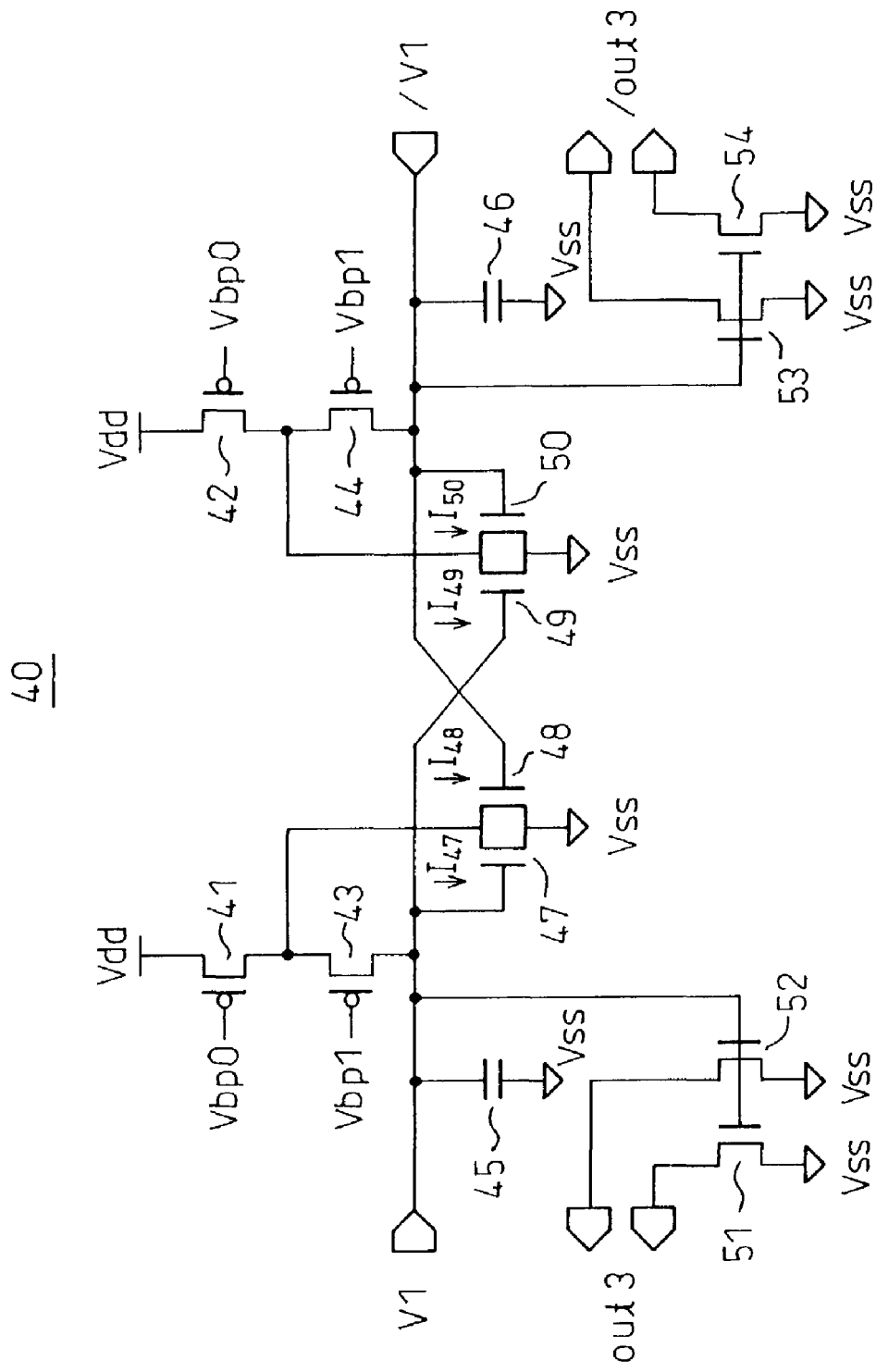
FIG. 24 is a block circuit diagram (part 2) showing the 12th embodiment of the data receiving circuit according to the present invention.

FIGS. 23 and 24 are block circuit diagrams showing a 12th embodiment of the data receiving circuit according to the present invention.

As shown in FIG. 23, the data receiving circuit of the 12th embodiment comprises four differential pairs 310, 32-0 to 31-3, 32-3, a switch circuit 340 (switch transistors 34-0 to 34-3), and signal processing sections 50-0 to 50-3. The signal processing section 50-3 comprises pMOS transistors 331 to 334, nMOS transistors 310 and 320, and an integrating circuit 40.

As shown in FIG. 24, the integrating circuit 40 comprises pMOS transistors 41 and 42 whose gates are supplied with a bias voltage Vpb0, pMOS transistors 43 and 44 whose gates are supplied with a bias voltage Vpb1, capacitors 45 and 46, and nMOS transistors 47 to 54. This integrating circuit 40 does not provide a differential operation, but adjusts a common voltage Vcm. For the currents $I_{47}$ to $I_{50}$ flowing through the transistors 47 to 50, the relation $I_{47}+I_{48}=I_{49}+I_{50}$ holds.

In this way, the data receiving circuit of the 12th embodiment employs the current-mode integrating circuit as in the foregoing 11th embodiment; however, in the 12th embodiment, the drains of each differential pair in the circuit that interfaces with the received signal are not connected directly to the integrating circuit, but connected via a low impedance load (folded cascode load), so that the amplitude of the drain node voltage, i.e., the output of the differential pair, is small and the differential-pair transistors can be operated under saturation conditions over a wide input range. This offers the advantage of increased input common-mode range and hence, increased dynamic range for the input amplitude.

Figure 25A:
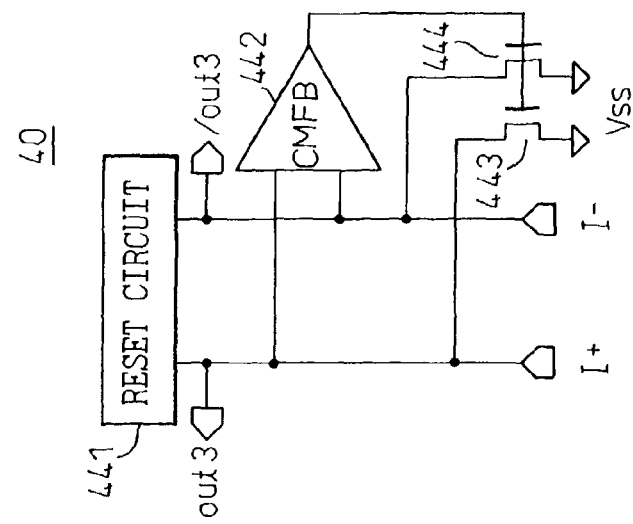
FIGS. 25A, 25B, and 25C are block circuit diagrams showing modified examples of the data receiving circuit of the present invention.
Figure 25B:
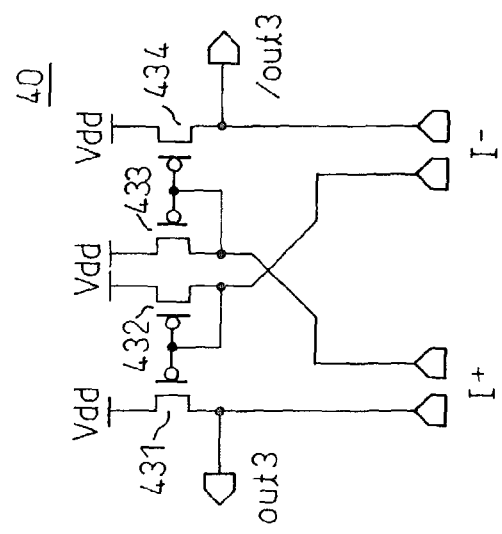
Figure 25C:
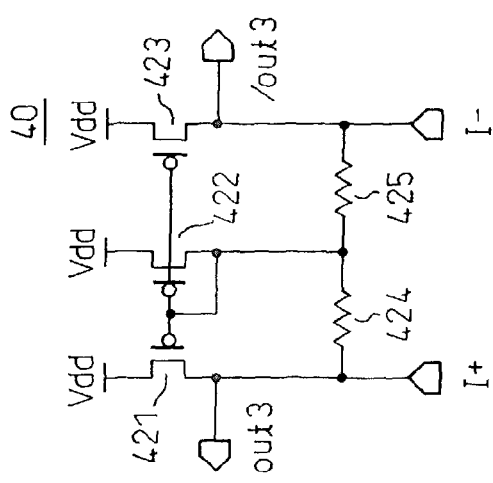

FIGS. 25A, 25B, and 25C are block circuit diagrams showing modified examples of the data receiving circuit of the present invention, that is, examples of the integrating circuit are shown here.

In each of the above-described embodiments, only reset pMOS transistors are provided as the load for the integrating circuit, and are left open during integration; however, if the load is simply left open, there occurs a situation where the output common-mode voltage drops as the integration progresses. If the output common mode drops, it becomes difficult for the regenerative latch to make a decision on the received data.

In view of this, in the integrating circuit shown in FIG. 25A, the output of the integrator is fed back as the gate voltage to PMOS loads (transistors 421 to 423) to prevent the output common-mode voltage from dropping too far. Here, the gate voltage to the PMOS loads is generated by a resistive divider consisting of resistors 424 and 425.

On the other hand, in the integrating circuit shown in FIG. 25B, the gate voltage to the pMOS loads (transistors 431 to 434) is created using a differential pair that produces the common-mode current.

Further, in the integrating circuit shown in FIG. 25C, a common-mode feedback circuit 442 and nMOS transistors 443 and 444 are provided for a reset circuit 441 (reset PMOS transistors), and the gate voltage to the reset pMOS transistors is created by applying the output of the common-mode feedback circuit 442 to the gates of the nMOS transistors 443 and 444.

According to the integrating circuits shown in FIGS. 25A to 25C, as the output common-mode voltage of the integrating circuit does not drop (or rise) too far, the circuit can be operated with a wider input common-mode voltage.

It will be appreciated that the data receiving circuit according to each of the embodiments of the present invention described above may be configured as a circuit that receives a single-ended input signal Din or as a circuit that receives differential input signals (Din, /Din).

According to each embodiment of the present invention, high-speed DEMUX can be achieved with a small amplitude clock, and a high-speed data receiving circuit free from input signal amplitude dependent jitter can be realized. Furthermore, by utilizing the characteristic that the output of the DEMUX is a current output, signal processing operations such as integration and current addition can be performed, achieving higher S/N ratio for signal reception.

The data receiving circuits of the above embodiments have each been described as either a single-ended or differential circuit, but it will be appreciated that they may be configured as single-ended or differential circuits as needed, and also that the transistor configuration such as the conductivity of each transistor can be changed as needed.

As described in detail above, according to the present invention, it becomes possible to provide a data receiving circuit that can correctly receive data, even when high-speed data transmission is performed, using a small amplitude clock.

Many different embodiments of the present invention may be constructed without departing from the spirit and scope of the present invention, and it should be understood that the present invention is not limited to the specific embodiments described in this specification, except as defined in the appended claims.

What is claimed is:

1. A data receiving circuit having a data input terminal, a conversion circuit configured to convert an input signal received via said data input terminal, and a decision circuit configured to make a decision on an output of said conversion circuit,
- wherein said conversion circuit comprises a demultiplexer configured to convert said input signal into a signal of a lower frequency than the frequency thereof at said data input terminal,
- wherein an output of said demultiplexer is obtained at the drain side of each of a plurality of first transistors having a common source,
- wherein said data receiving circuit further comprises an integrating circuit configured to receive the output of said demultiplexer and integrate temporally consecutive multiple bit data by 1-bit data of said input signal, integrated values of said temporally consecutive multiple bit data are accumulated, and an accumulated value of said integrated values is obtained as a weight of sign and magnitude that differs for each bit of said input signal.

2. A data receiving circuit having a data input terminal, a conversion circuit configured to convert an input signal received via said data input terminal, and a decision circuit configured to make a decision on an output of said conversion circuit,
- wherein said conversion circuit comprises a demultiplexer configured to convert said input signal into a signal of a lower frequency than the frequency thereof at said data input terminal,
- wherein an output of said demultiplexer is obtained at the drain side of each of a plurality of first transistors having a common source,
- wherein said data receiving circuit further comprises an integrating circuit configured to receive the output of said demultiplexer and integrate 1-bit data of said input signal, and
- wherein said data receiving circuit further comprises an addition operation section obtaining a weighted sum of integrated results of each bit of said input signal after integration for the 1-bit data of said input signal is performed with the output of said demultiplexer, and wherein said decision circuit makes a decision on the result of addition operation of said weighted sum.

* * * * *